(12) United States Patent
Lin et al.

(10) Patent No.: US 12,525,482 B2
(45) Date of Patent: Jan. 13, 2026

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Shih-Yao Lin, New Taipei (TW); Cheng-Tien Chu, Hsinchu (TW); Chi-Wei Yang, Taoyuan (TW); Hsiao Wen Lee, Hsinchu (TW); Chih-Han Lin, Hsinchu (TW); Jr-Jung Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 760 days.

(21) Appl. No.: 17/459,784

(22) Filed: Aug. 27, 2021

(65) Prior Publication Data
US 2023/0063039 A1    Mar. 2, 2023

(51) Int. Cl.
H01L 21/762    (2006.01)
H10D 84/01     (2025.01)
H10D 84/03     (2025.01)
H10D 84/83     (2025.01)

(52) U.S. Cl.
CPC ... *H01L 21/76232* (2013.01); *H10D 84/0151* (2025.01); *H10D 84/0158* (2025.01); *H10D 84/038* (2025.01); *H10D 84/834* (2025.01)

(58) Field of Classification Search
CPC ......... H01L 27/0886; H01L 21/823431; H01L 21/845; H01L 21/823481; H01L 21/823878; H01L 29/785; H01L 29/66795
See application file for complete search history.

(56) References Cited

U.S. PATENT DOCUMENTS

| | | | |
|---|---|---|---|
| 2018/0061714 A1* | 3/2018 | Zhang | H10D 84/0144 |
| 2019/0305099 A1* | 10/2019 | Jo | H01L 21/76224 |
| 2019/0393352 A1* | 12/2019 | Guha | H10D 30/6735 |
| 2020/0044070 A1* | 2/2020 | Wang | H10D 30/62 |

\* cited by examiner

*Primary Examiner* — Tuan A Hoang
(74) *Attorney, Agent, or Firm* — FOLEY & LARDNER LLP

(57) ABSTRACT

A method for making a semiconductor device includes forming a first fin structure, a second fin structure, and a third fin structure over a substrate. The first through third fin structures all extend along a first lateral direction, and the second fin structure is disposed between the first and third fin structures. The method includes forming a mold by filling up trenches between neighboring ones of the first through third fin structures with a first dielectric material. The method includes cutting the second fin structure by removing an upper portion of the second fin structure. The method includes replacing the upper portion of the second fin structure with a second dielectric material to form a dielectric cut structure. The method includes recessing the mold to expose upper portions of the first fin structure and the third fin structure, respectively.

20 Claims, 46 Drawing Sheets

300

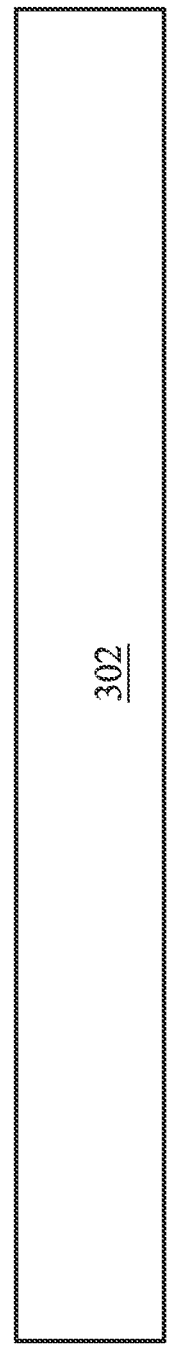

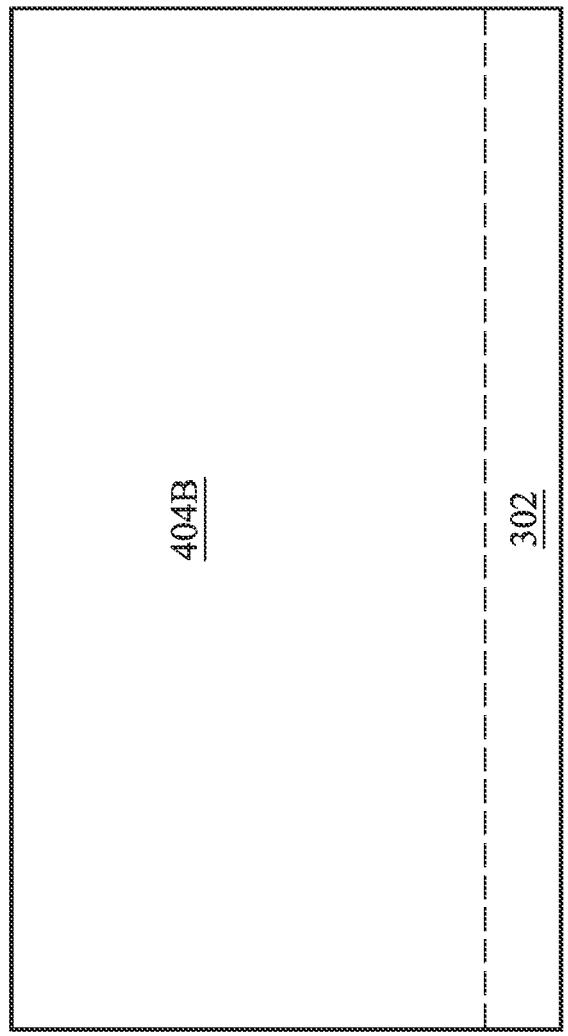

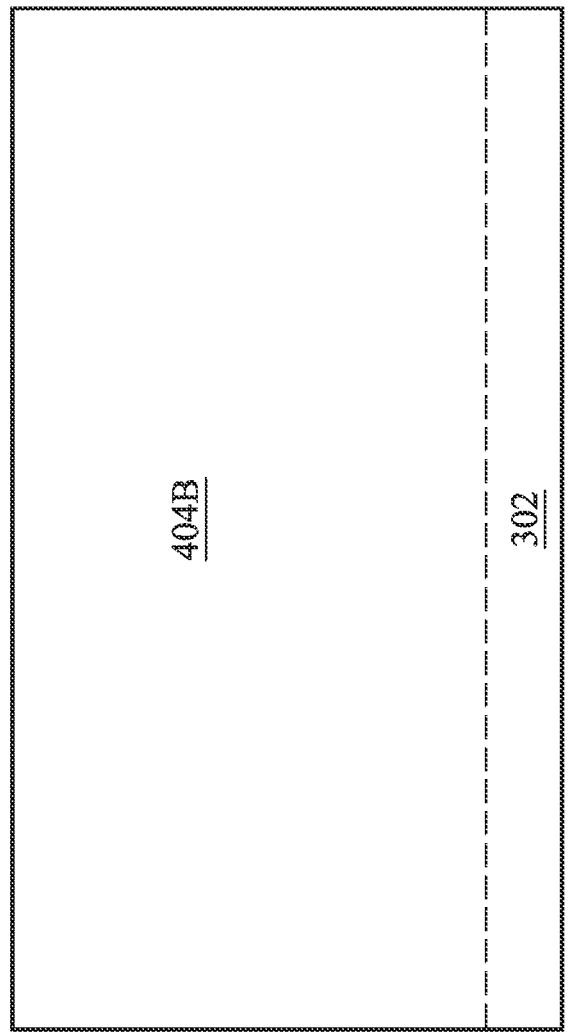

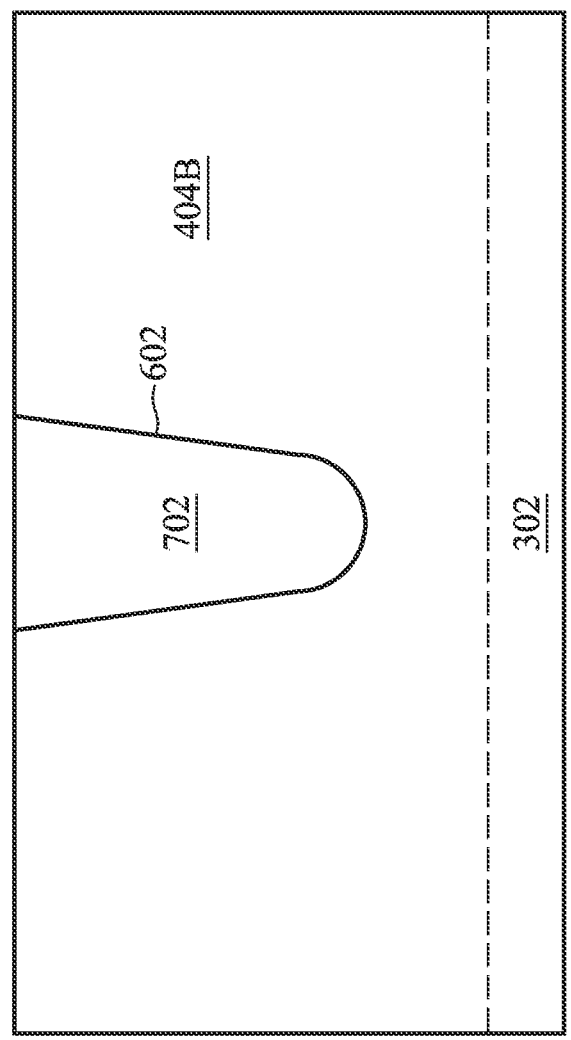

SEMICONDUCTOR DEVICES AND METHODS OF MANUFACTURING THEREOF

BACKGROUND

The present disclosure generally relates to semiconductor devices, and particularly to methods of making a non-planar transistor device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4A, 4B, 5A, 5B, 5C, 6A, 6B, 6C, 6D, 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, and 17C illustrate cross-sectional or top views of an example FinFET device (or a portion of the example FinFET device) during various fabrication stages, made by the method of FIG. 2, in accordance with some embodiments.

DETAILED DESCRIPTION

Figure 1:
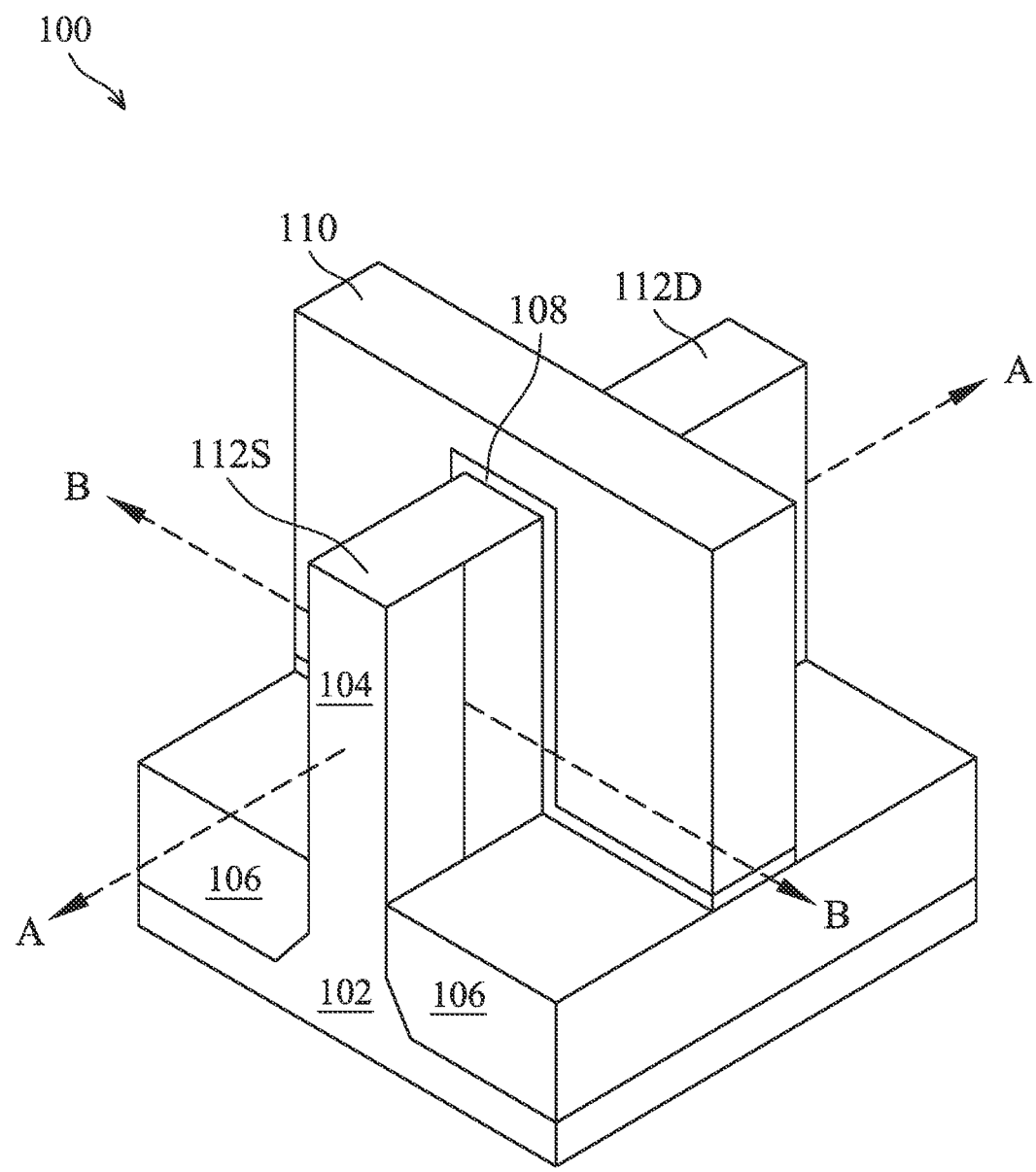
FIG. 1 illustrates a perspective view of an example FinFET device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit typically includes a large number of devices (e.g., transistors). To fabricate these devices, a number of active regions (e.g., formed as fin structures) and a number of gate structures that intersect the fin structures can be formed on a substrate or wafer to define such devices. To configure those device to operate as certain circuits, some of the devices can be operatively connected to or disconnected from each other. For example, one or more of the fin structures may be cut or otherwise discontinued in certain areas on the substrate, while other fin structures may remain continuously extended along the substrate. In advanced technology nodes, the fin structures are generally spaced from one another with a relatively short distance. Accordingly, while cutting the desired fin structure, neighboring fin structures, which are not desired to be cut, may be damaged, which may adversely impact overall performance of the whole integrated circuit.

Embodiments of the present disclosure are discussed in the context of forming non-planar devices (e.g., FinFET devices, gate-all-around (GAA) transistor devices), and in particular, in the context of forming a dielectric mold while cutting a fin structure. Different from the existing technologies, the disclosed method provides cutting one or more of a number of fin structures, following the formation of a mold disposed between adjacent ones of the fin structures. As such, the mold can serve as an etch stop layer protecting other fin structures that are not desired to be cut. In various embodiments, the mold can be later recessed to form shallow trench isolation (STI) regions/structures between the respective lower portions of any neighboring fin structures. With the mold protecting such uncut fin structures, a process window to cut the fin structure, even spaced from neighboring fin structures with a short distance, may be advantageously enlarged (e.g., a larger amount of etchants). Consequently, it can be more accurate and reliable to fabricate an integrated circuit that includes a large number of transistors.

FIG. 1 illustrates a perspective view of an example FinFET device 100, in accordance with various embodiments. The FinFET device 100 includes a substrate 102 and a fin 104 protruding from the substrate 102. Isolation regions 106 are formed on opposing sides of the fin 104, with the fin 104 protruding above the isolation regions 106. A gate dielectric 108 is along sidewalls and over a top surface of the fin 104, and a gate 110 is over the gate dielectric 108. Source region 112S and drain region 112D are in (or extended from) the fin 104 and on opposing sides of the gate dielectric 108 and the gate 110. FIG. 1 is provided as a reference to illustrate a number of cross-sections in subsequent figures. For example, cross-section B-B extends along a direction in parallel with a longitudinal axis of the gate 110 of the FinFET device 100, for example, intersecting one of the source region 112S or drain region 112D. Cross-section A-A is perpendicular to cross-section B-B and is along a longitudinal axis of the fin 104 and in a direction of, for example, a current flow between the source/drain regions 112S/112D. Subsequent figures refer to these reference cross-sections for clarity.

Figure 2:
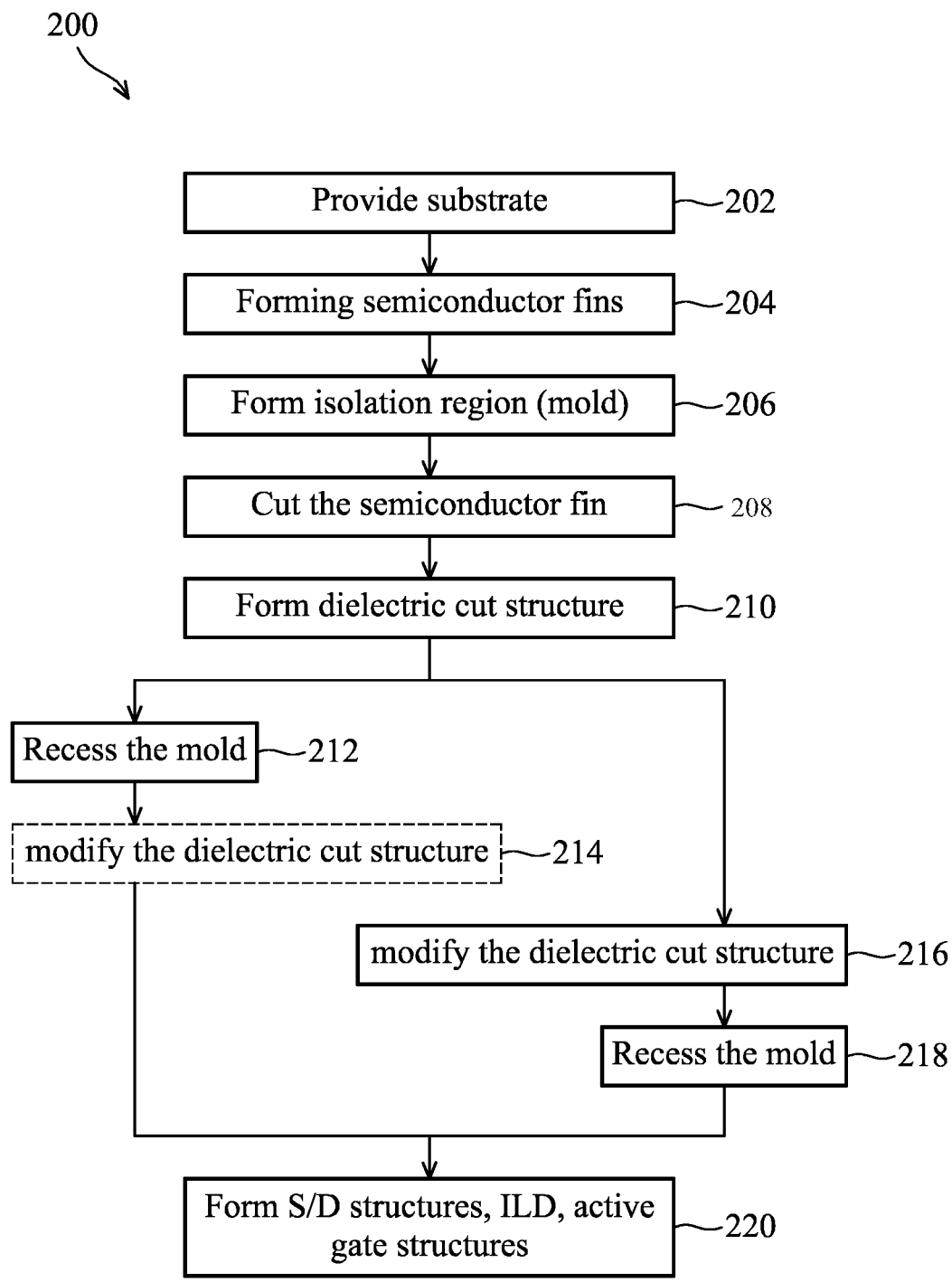
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET device (e.g., semiconductor device 100). However, it should be understood that the method 200 can be used to form a nanosheet transistor device, a nanowire transistor device, a vertical transistor device, a gate-all-around (GAA) transistor device, or the like, while remaining within the scope of the present disclosure. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional or top views of an example FinFET device at various fabrication stages as shown in FIGS. 3, 4A, 4B, 5A, 5B, 5C, 6A, 6B, 6C, 6D, 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, and 17C, respectively, which will be discussed in further detail below.

In brief overview, the method 200 starts with operation 202 of providing a substrate. The method 200 continues to operation 204 of forming a number of active fins. The method 200 continues to operation 206 of forming an isolation structure. The method 200 continues to operation 208 of cutting one or more of the active fins. The method 200 continues to operation 210 of forming a number of dummy fins. The method 200 continues to operation 212 of forming a dummy gate structure over the active fins. The method 200 continues to operation 214 of forming a gate spacer. The method 200 continues to operation 216 of growing source/drain structures. The method 200 continues to operation 218 of forming an interlayer dielectric (ILD). The method 200 continues to operation 220 of recessing one or more of the dummy fins. The method 200 continues to operation 222 of forming an active gate structure.

Corresponding to operation 202 of FIG. 2, FIG. 3 is a cross-sectional view of the FinFET device 300 including a semiconductor substrate 302 at one of the various stages of fabrication. The cross-sectional view of FIG. 3 is cut along a direction in parallel with the lengthwise direction of an active/dummy gate structure of the FinFET device 300 (e.g., cross-section B-B indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4A:
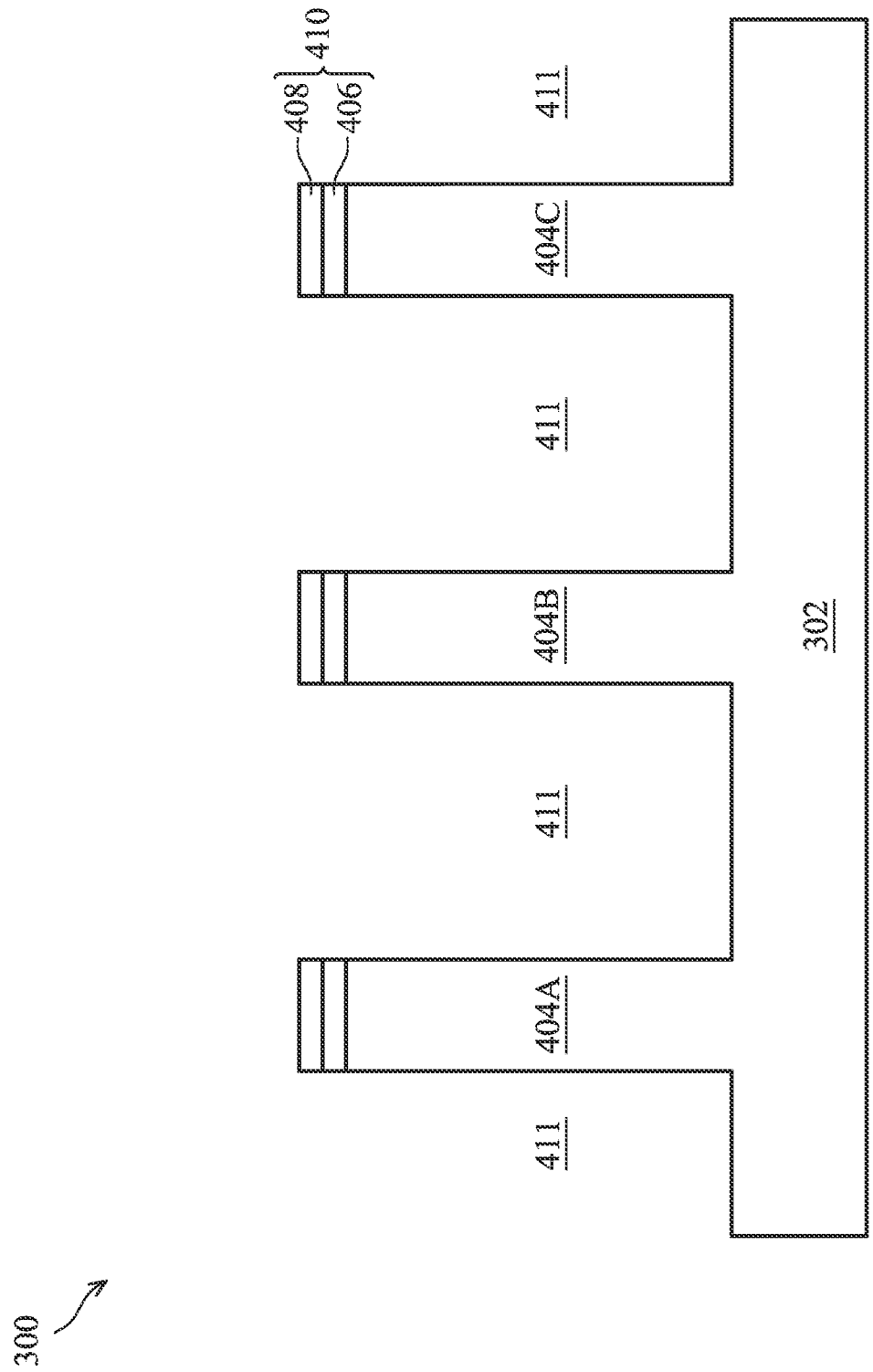

Corresponding to operation 204 of FIG. 2, FIG. 4A is a cross-sectional view of the FinFET device 300 including semiconductor fins 404A, 404B, and 404C at one of the various stages of fabrication. The cross-sectional view of FIG. 4A is cut along a direction in parallel with the lengthwise direction of an active/dummy gate structure of the FinFET device 300 (e.g., cross-section B-B indicated in FIG. 1). Corresponding to the same operation, FIG. 4B is another cross-sectional view of the FinFET device 300 cut along a lengthwise direction of one of the semiconductor fins, 404B (e.g., cross-section A-A indicated in FIG. 1).

The semiconductor fins 404A-C may be each configured as an active fin (structure), which will be adopted as an active (e.g., electrically functional) fin or channel in a respective completed FinFET. Hereinafter, the semiconductor fins 404A through 404C may sometimes be referred to as "active fins 404A, 404B, and 404C," respectively. Although three semiconductor fins are shown in the illustrated example, it should be appreciated that the FinFET device 300 can include any number of active fins while remaining within the scope of the present disclosure.

The active fins 404A-C are formed by patterning the substrate 302 using, for example, photolithography and etching techniques. For example, a mask layer, such as a pad oxide layer 406 and an overlying pad nitride layer 408, is formed over the substrate 302. The pad oxide layer 406 may be a thin film comprising silicon oxide formed, for example, using a thermal oxidation process. The pad oxide layer 406 may act as an adhesion layer between the substrate 302 and the overlying pad nitride layer 408. In some embodiments, the pad nitride layer 408 is formed of silicon nitride, silicon oxynitride, silicon carbonitride, the like, or combinations thereof. Although only one pad nitride layer 408 is illustrated, a multilayer structure (e.g., a layer of silicon oxide on a layer of silicon nitride) may be formed as the pad nitride layer 408. The pad nitride layer 408 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 406 and pad nitride layer 408 to form a patterned mask 410, as illustrated in FIG. 4A.

The patterned mask 410 is subsequently used to pattern exposed portions of the substrate 302 to form trenches (or openings) 411, thereby defining the active fins 404A-C between adjacent trenches 411 as illustrated in FIG. 4A. When multiple fins are formed, such a trench may be disposed between any adjacent ones of the fins. In some embodiments, the active fins 404A-C are formed by etching trenches in the substrate 302 using, for example, reactive ion etch (ME), neutral beam etch (NBE), the like, or combinations thereof. The etch may be anisotropic. In some embodiments, the trenches 411 may be strips (viewed from the top) parallel to each other, and closely spaced with respect to each other. In some embodiments, the trenches 411 may be continuous and surround the active fins 404A-C.

The active fins 404A-C may be patterned by any suitable method. For example, the active fins 404A-C may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

FIGS. 3-4B illustrate an embodiment of forming the active fins 404A-C, but a fin may be formed in various different processes. For example, a top portion of the substrate 302 may be replaced by a suitable material, such as an epitaxial material suitable for an intended type (e.g., N-type or P-type) of semiconductor devices to be formed. Thereafter, the substrate 302, with epitaxial material on top, is patterned to form the active fins 404A-C that include the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the active fins 404A-C may include silicon germanium ($Si_xGe_{1-x}$, where x can be between 0 and 1), silicon carbide, pure silicon, pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5A:
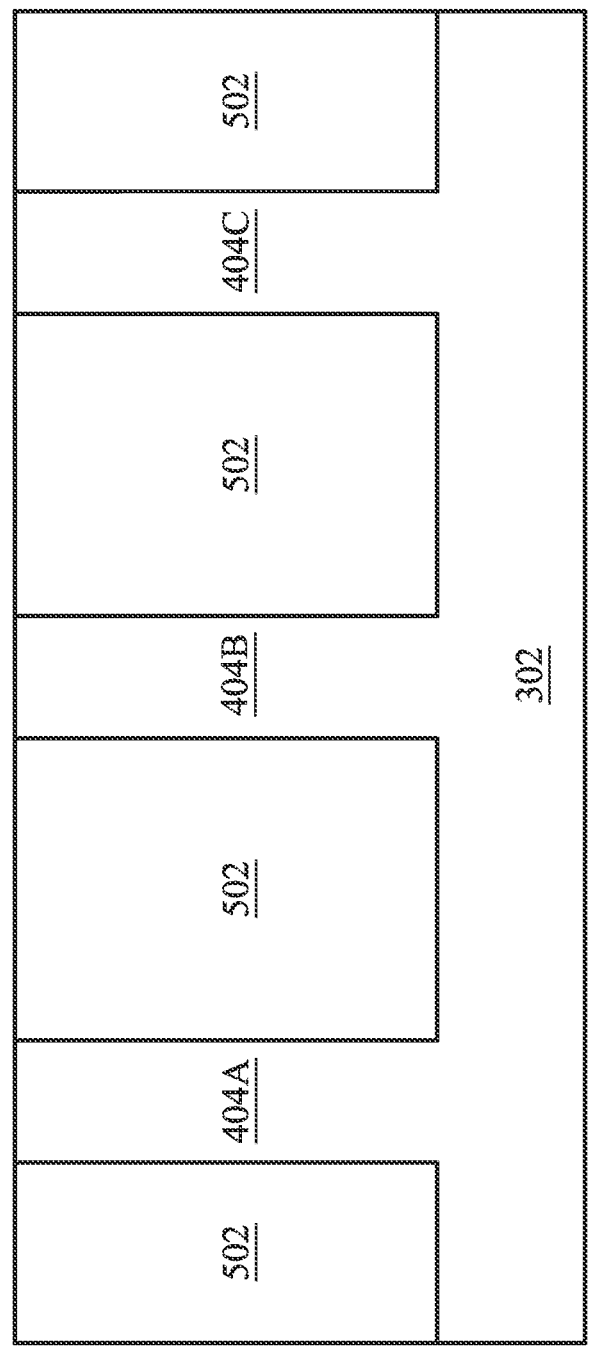

Corresponding to operation 206 of FIG. 2, FIG. 5A is a cross-sectional view of the FinFET device 300 including an isolation region/structure 502 at one of the various stages of fabrication. The cross-sectional view of FIG. 5A is cut along a direction in parallel with the lengthwise direction of an active/dummy gate structure of the FinFET device 300 (e.g., cross-section B-B indicated in FIG. 1). Corresponding to the same operation, FIG. 5B is another cross-sectional view of the FinFET device 300 cut along a lengthwise direction of one of the active fins, 404B (e.g., cross-section A-A indicated in FIG. 1).

The isolation structure 502, which is formed of an insulation material, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP), may remove any excess insulation material to form top surfaces of the isolation structure 502 and top surfaces of the fins 404A-C as a coplanar surface. The patterned mask 410 (FIG. 4A) may also be removed by the planarization process.

In some embodiments, the isolation structure 502 includes a liner, e.g., a liner oxide (not shown), at the interface between the isolation structure 502 and the substrate 302 (active fins 404A-C). In some embodiments, the liner oxide is formed to reduce crystalline defects at the interface between the substrate 302 and the isolation structure 502. Similarly, the liner oxide may also be used to reduce crystalline defects at the interface between the active fins 404A-C and the isolation structure 502. The liner oxide (e.g., silicon oxide) may be a thermal oxide formed through a thermal oxidation of a surface layer of the substrate 302, although other suitable method may also be used to form the liner oxide.

Figure 5C:
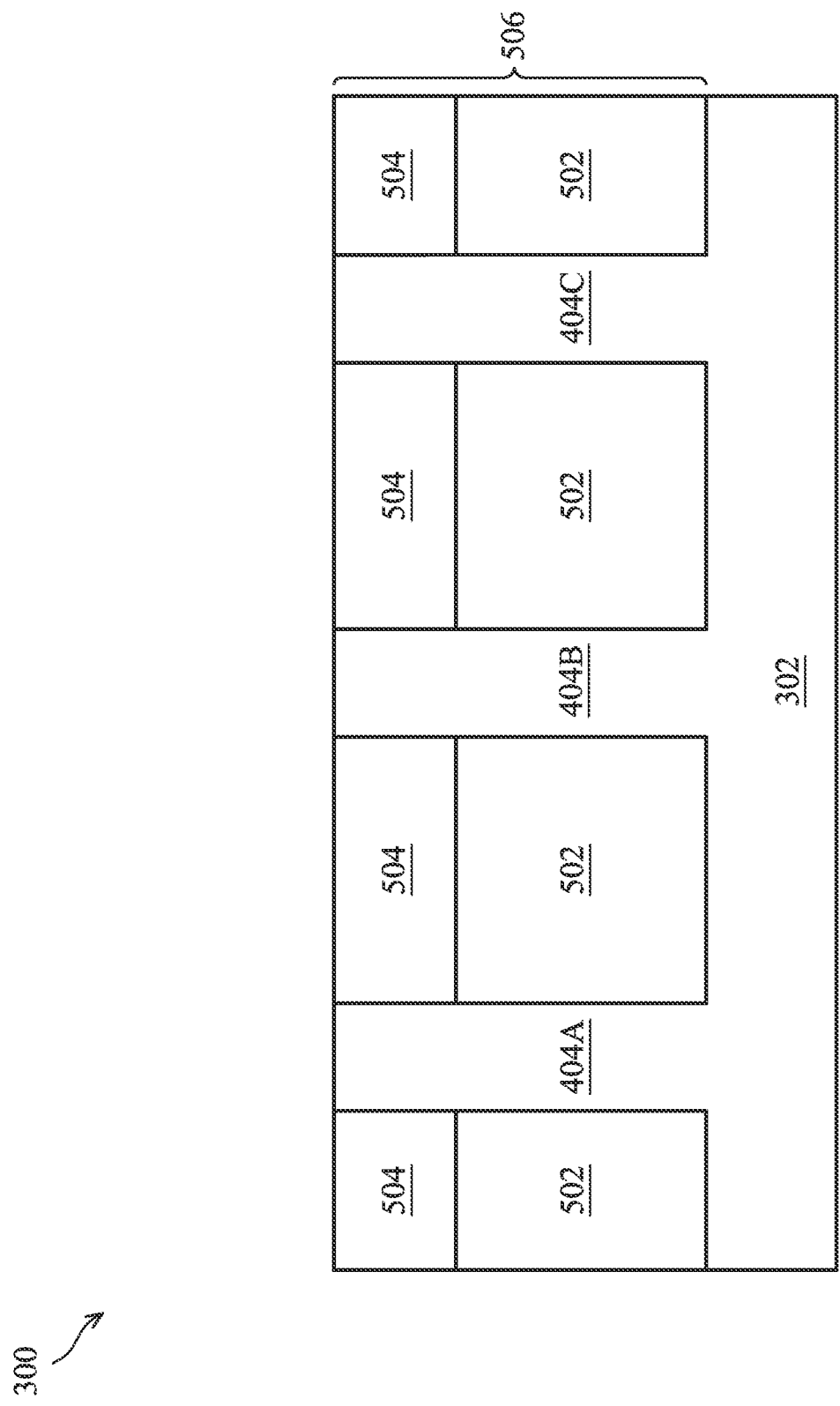

Alternatively or additionally, FIG. 5C illustrates a cross-sectional view of the FinFET device 300 including one or more additional layers 504 over the single-stack isolation structure 502 to form a multi-stack isolation structure 506 at one of the various stages of fabrication. The cross-sectional view of FIG. 5C is also cut along a direction in parallel with the lengthwise direction of an active/dummy gate structure of the FinFET device 300 (e.g., cross-section B-B indicated in FIG. 1).

To form such a multi-stack isolation structure 506, following the above-described planarization process, the isolation structure 502 may be recessed. As such, respective upper portions of the active fins 404A-C may protrude from between neighboring isolation structure 502. Next, such recessed portions are filled up with an insulation material, which may be similar to or different from the insulation material of the isolation structure 502, followed by another planarization process. Consequently, top surfaces of the layer 504 and the top surfaces of the fins 404A-C may be formed as a coplanar surface.

In some embodiments, the insulation material of the layer 504 may include a silicon-based material such as, for example, silicon oxide (SiO), silicon nitride (SiN), silicon carbide (SiC), silicon carbide nitride (SiCN), silicon oxycarbonitride (SiOCN), silicon oxynitride (SiON), silicon oxycarbide (SiOC), or combinations thereof. In some embodiments, the insulation material of the layer 504 may include a metal-based material such as, for example, hafnium oxide (HfO), aluminium oxide ($Al_2O_3$), copper oxide (CuO), titanium nitride (TiN), or combinations thereof. In some embodiments, the insulation material of the layer 504 may include a complex material such as, for example, a complex material of hafnium oxide and silicon (HfOSi), a complex material of titanium nitride and silicon (TiNSi), or combinations thereof. The layer 504 may be formed by a high density plasma chemical vapor deposition (HDP-CVD), a flowable CVD (FCVD), atomic layer deposition (ALD), epitaxial deposition, plasma-enhanced chemical vapor deposition (PECVD), plasma-enhanced atomic layer deposition (PEALD), or combinations thereof, following the formation of the isolation structure 502. Other insulation materials and/or other formation processes may be used, while remaining within the scope of the present disclosure.

In some embodiments, the single-stack isolation structure 502 and the multi-stack isolation structure 506 may each serve as a mold. Specifically, while cutting one of the active fins (which will be discussed below), such a mold can protect the neighboring active fins from the cutting process.

Accordingly, the single-stack isolation structure 502 and multi-stack isolation structure 506 may sometimes be referred to as mold 502 and mold 506, respectively, in the following discussions.

Figure 6A:
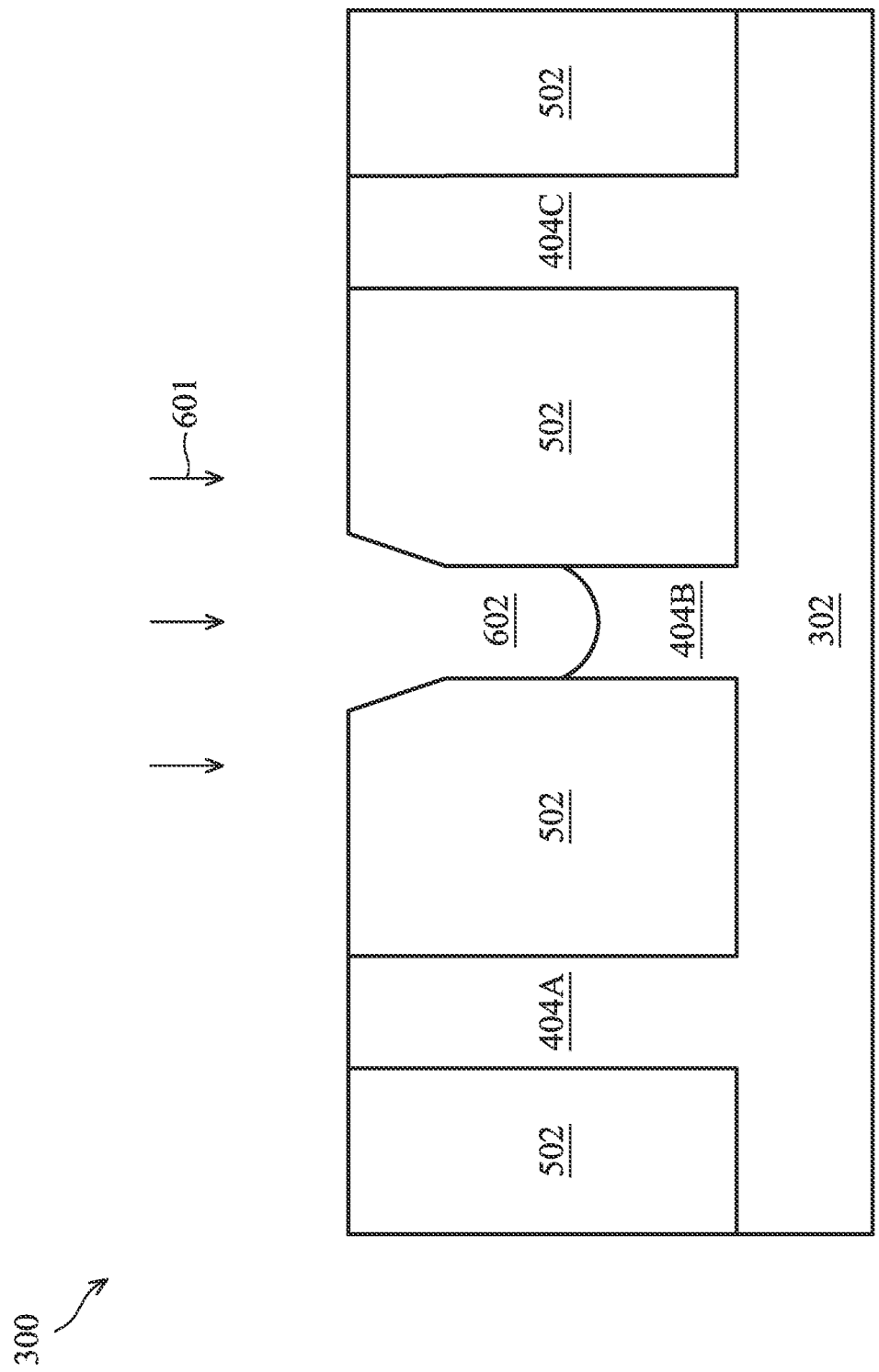
Figure 6B:
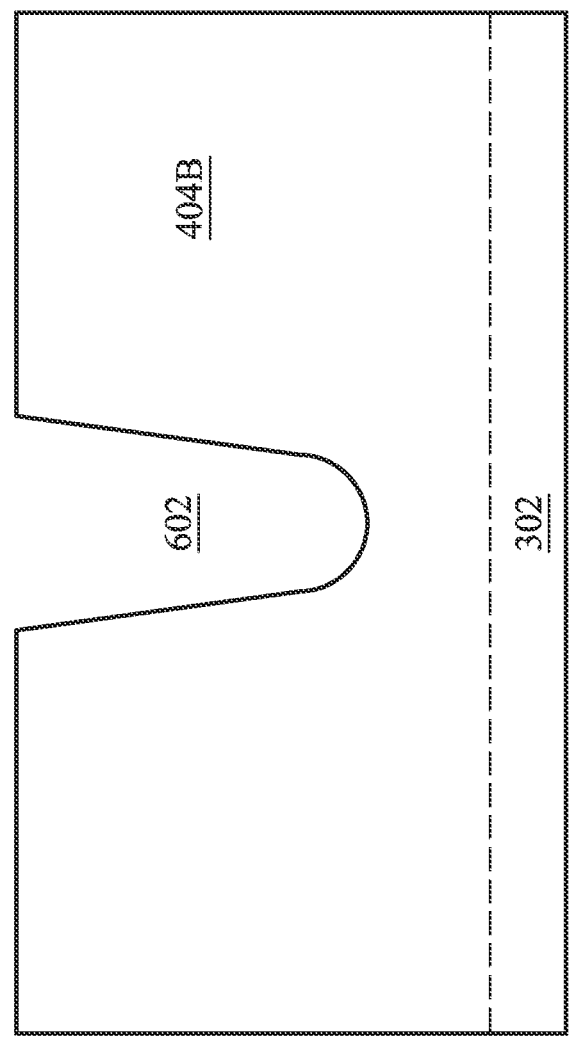

Corresponding to operation 208 of FIG. 2, FIG. 6A is a cross-sectional view of the FinFET device 300 in which one of the active fins, e.g., 404B, is cut or otherwise discontinued at one of the various stages of fabrication. The cross-sectional view of FIG. 6A is cut along a direction in parallel with the lengthwise direction of an active/dummy gate structure of the FinFET device 300 (e.g., cross-section B-B indicated in FIG. 1). Corresponding to the same operation, FIG. 6B is another cross-sectional view of the FinFET device 300 cut along a lengthwise direction of the active fin, 404B (e.g., cross-section A-A indicated in FIG. 1). For purposes of clarity of illustration, FIG. 6C illustrates a top view of the FinFET device 300 that corresponds to the same operation.

Figure 6C:
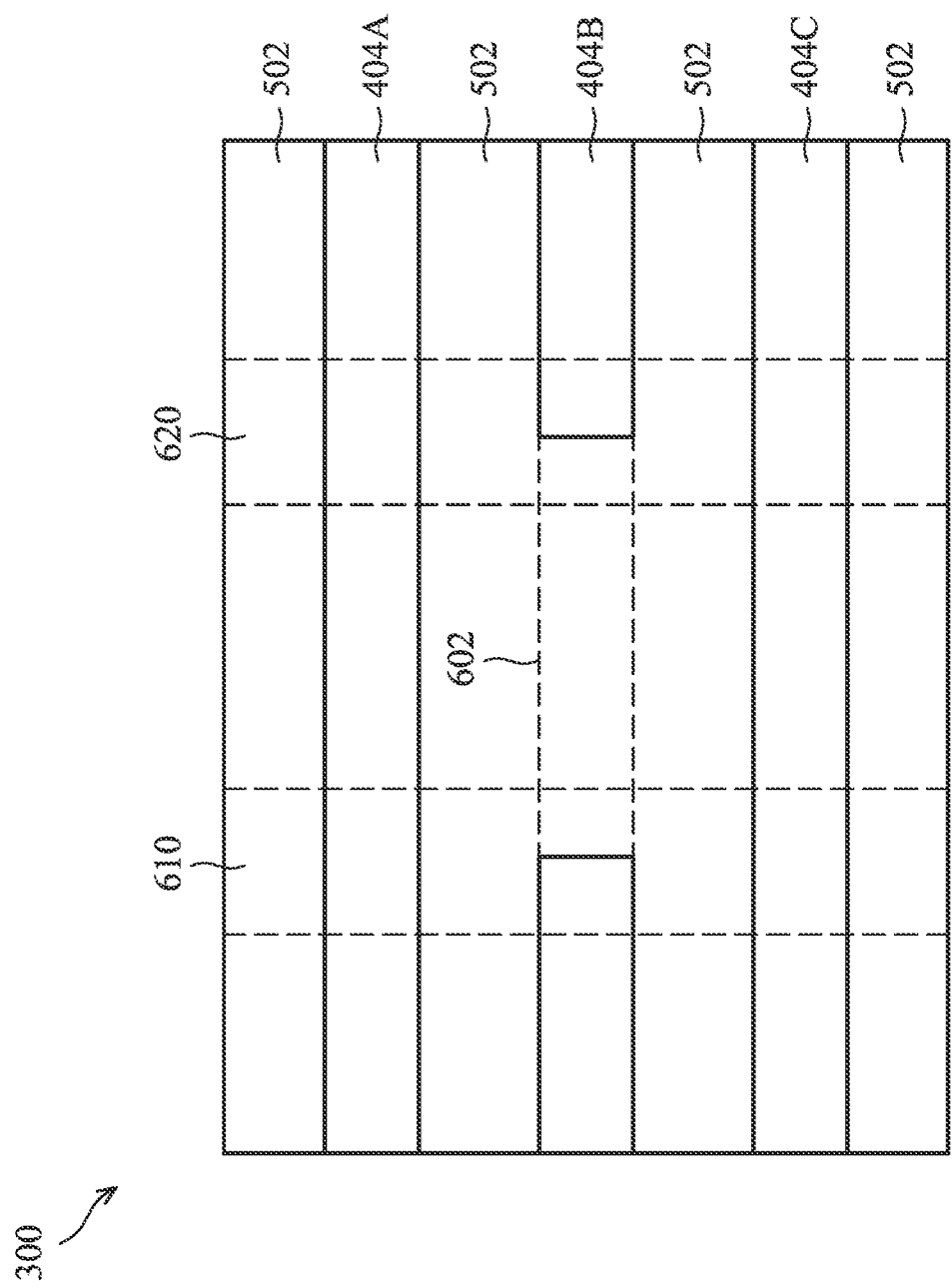

An etching process 601 may be performed to remove a portion of the active fin 404B to form a recess 602, which is enclosed by a dotted line in the top view of FIG. 6C. The recess may partially extend through the single-stack mold 502. This cut (or discontinued) active fin 404B (i.e., with one or more its portions removed) can be better appreciated in the cross-sectional view of FIG. 6B and the top view of FIG. 6C. In accordance with various embodiments, during the etching process 601, the mold 502 (e.g., the portions of the mold 502 adjacent the active fin 404B) may serve as an etch stop layer. Alternatively stated, the mold 502 and the active fin 404B may have respective different etching rates with respect to the etching process 601. For example, the etching process 601 may remove the material of the active fin 404B at a higher rate than the mold 502. As a result, a relatively small amount of the mold 502 (adjacent the active fin 404B) may be removed, as shown in the cross-sectional view of FIG. 6A. Specifically, the recess 602 may have a tapered profile, with an increasing depth toward the substrate 302, in some embodiments. For example in FIG. 6A, the recess 602 presents a wider upper portion and a narrower lower portion. In another example, the mold 502 may remain substantially intact during the etching process 601. As such, the recess 602 may present a non-tapered profile (not shown), in which the recess 602 has a common width throughout an extension direction of the recess 602.

The etching process 601 can remove the portion of the active fin 404B, while covering the active fins 404A and 404C, in accordance with various embodiments. Thus, the active fins 404A and 404C may remain substantially intact, e.g., continuously extending from one point to the other point on the substrate 302. By contrast, the active fin 404B, which may continuously extend between the same points as the active fins 404A and 404C upon being formed at operation 204, may be cut into a number of discontinuous portions at operation 208, as shown in FIG. 6C. In various embodiments, a gate structure may be formed over a cut edge of the active fin 404B. FIG. 6C illustrates footprints 610 and 620 of such gate structures.

For example, the etching process 601 may be configured to have at least some anisotropic etching characteristic. For example, the etching process can include a plasma etching process, which can have a certain amount of anisotropic characteristic. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the gas sources and/or the passivation gases can be diluted with gases such as argon (Ar), helium (He), neon (Ne), and other suitable dilutive gases and combinations thereof to control the above-described etching rates. As a non-limiting example, a source power of 10 watts to 3000 watts, a bias power of 0 watts to 3000 watts, a pressure of 1 millitorr to 5 torr, and an etch gas flow of 0 standard cubic centimeters per minute to 5000 standard cubic centimeters per minute may be used in the etching process. However, it is noted that source powers, bias powers, pressures, and flow rates outside of these ranges are also contemplated.

In another example, the etching process 601 can include a wet etching process, which can have a certain amount of isotropic characteristic, in combination with the plasma etching process. In such a wet etching process, a main etch chemical such as hydrofluoric acid (HF), fluorine ($F_2$), and other suitable main etch chemicals and combinations thereof can be used with assistive etch chemicals such as sulfuric acid ($H_2SO_4$), hydrogen chloride (HCl), hydrogen bromide (HBr), ammonia ($NH_3$), phosphoric acid ($H_3PO_4$), and other suitable assistive etch chemicals and combinations thereof as well as solvents such as deionized water, alcohol, acetone, and other suitable solvents and combinations thereof.

Figure 6D:
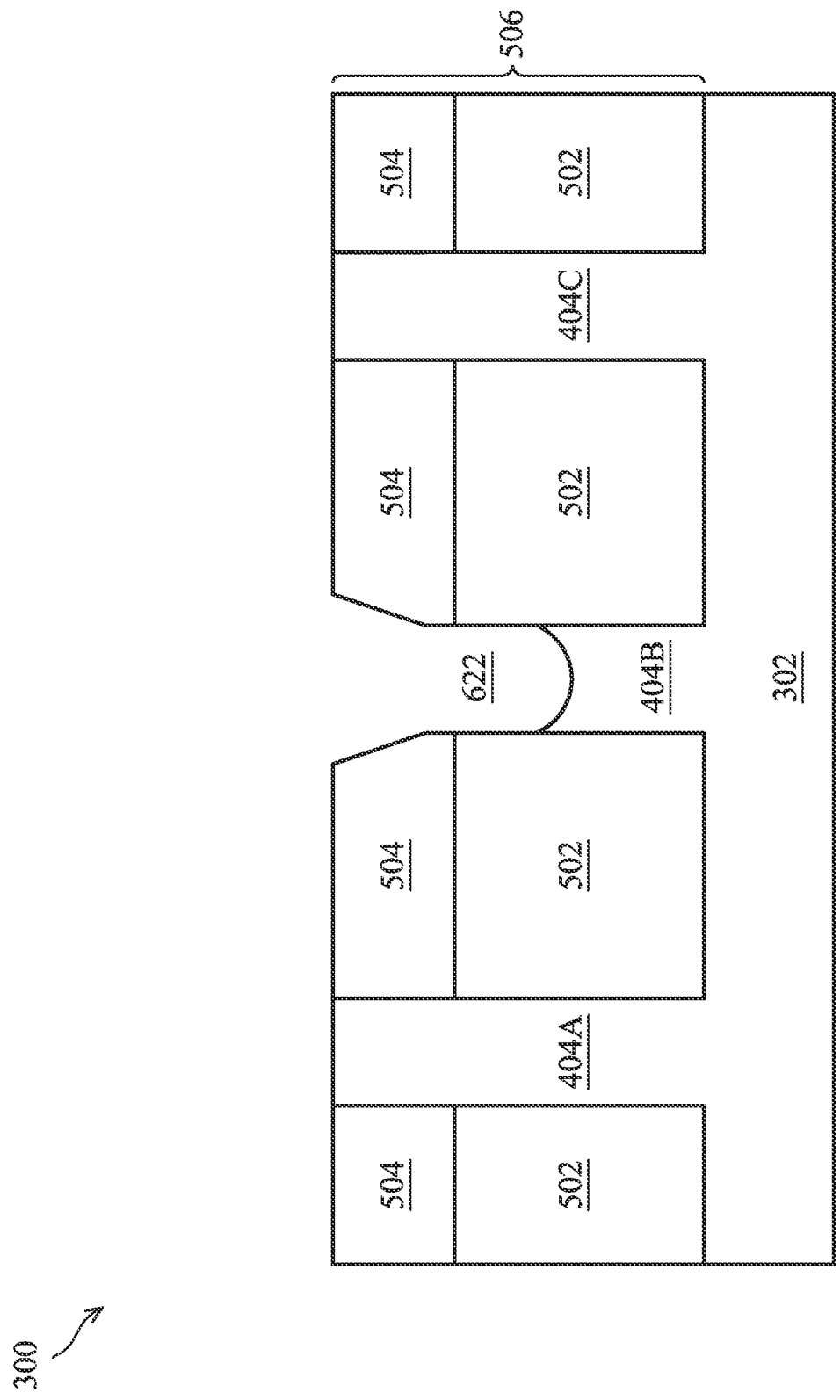

Alternatively or additionally, FIG. 6D illustrates a cross-sectional view of the FinFET device 300 in which a recess 622 partially extends through the multi-stack mold 506 at one of the various stages of fabrication. The cross-sectional view of FIG. 6D is also cut along a direction in parallel with the lengthwise direction of an active/dummy gate structure of the FinFET device 300 (e.g., cross-section B-B indicated in FIG. 1). To form the recess 622, the above-described etching process (e.g., 601) may be formed over the workpiece shown in FIG. 5C. For example, one or more of the etching process 601 may be performed over the active fin 404B, while using the layer 504 as an etch stop layer.

Figure 7A:
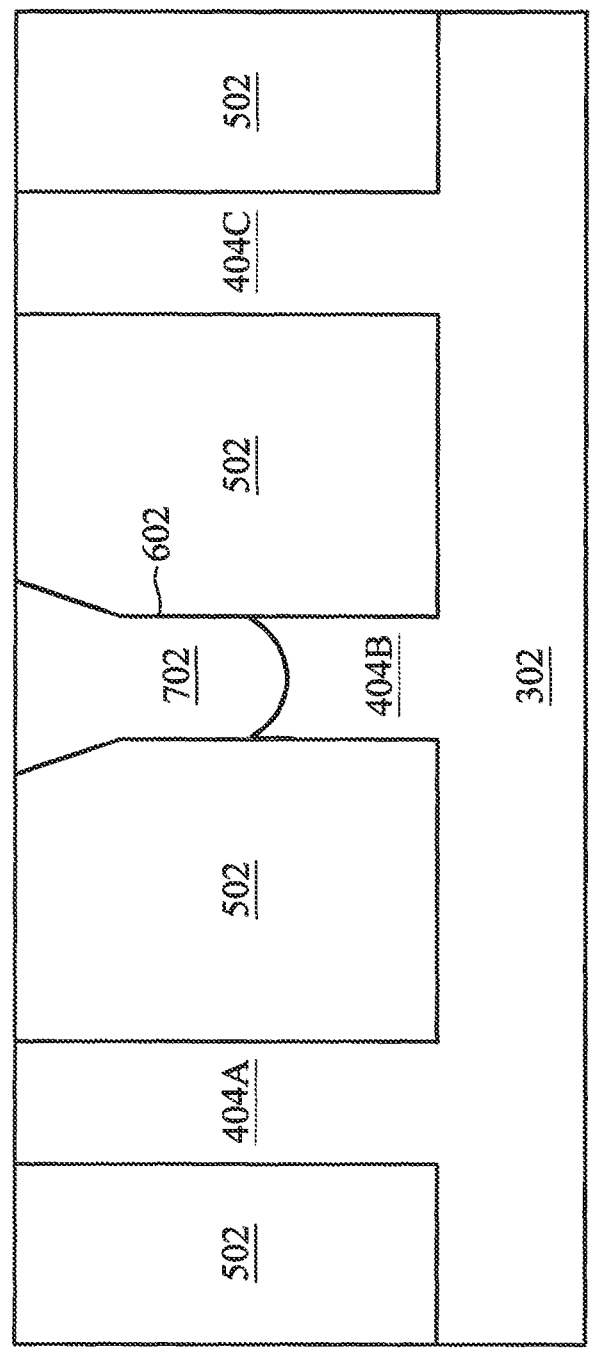

Corresponding to operation 210 of FIG. 2, FIG. 7A is a cross-sectional view of the FinFET device 300 including a dielectric cut structure 702 at one of the various stages of fabrication. The cross-sectional view of FIG. 7A is cut along a direction in parallel with the lengthwise direction of an active/dummy gate structure of the FinFET device 300 (e.g., cross-section B-B indicated in FIG. 1). Corresponding to the same operation, FIG. 7B is another cross-sectional view of the FinFET device 300 cut along a lengthwise direction of the active fin, 404B (e.g., cross-section A-A indicated in FIG. 1).

Figure 7C:
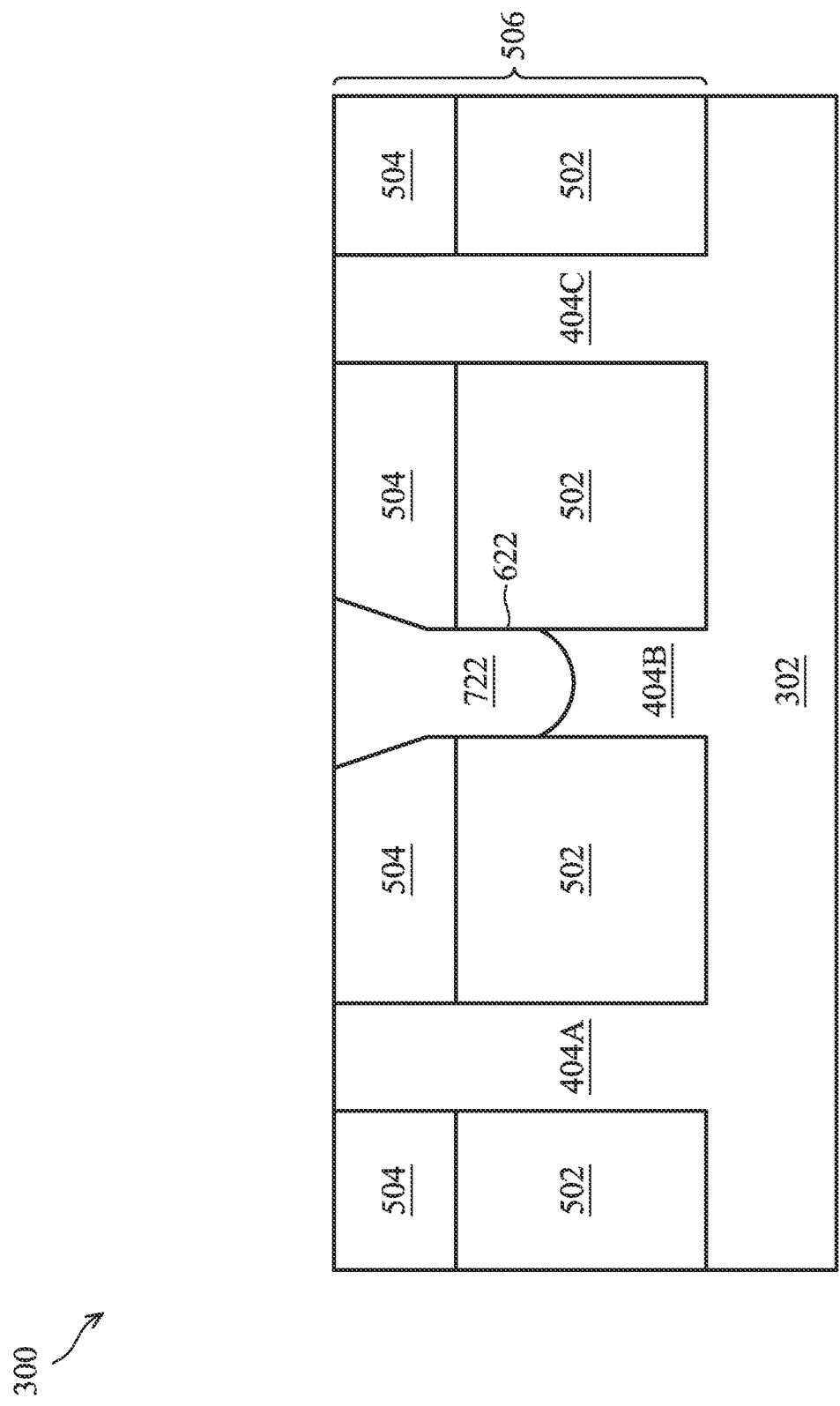

The dielectric cut structure 702 may be formed by filling the recess 602, which partially extends through the single-stack mold 502, with an insulation material. As such, the dielectric cut structure 702 can inherit the profile and dimensions of the recess 602, as shown in FIG. 7A. Alternatively or additionally, a dielectric cut structure 722 may be formed by filling the recess 622 (FIG. 6D), which partially extends through the multi-stack mold 506, with an insulation material. As such, the dielectric cut structure 722 can inherit the profile and dimensions of the recess 622, as shown in FIG. 7C.

In some embodiments, the insulation material of the dielectric cut structure 702/722 may include a silicon-based material such as, for example, silicon oxide (SiO), silicon nitride (SiN), silicon carbide (SiC), silicon carbide nitride (SiCN), silicon oxycarbonitride (SiOCN), silicon oxynitride (SiON), silicon oxycarbide (SiOC), or combinations thereof. In some embodiments, the insulation material of the dielectric cut structure 702/722 may include a metal-based material such as, for example, hafnium oxide (HfO), aluminium oxide ($Al_2O_3$), copper oxide (CuO), titanium nitride (TiN), or combinations thereof. In some embodiments, the insulation material of the dielectric cut structure 702/722 may include a complex material such as, for example, a complex material of hafnium oxide and silicon (HfOSi), a complex material of titanium nitride and silicon (TiNSi), or combinations thereof. The dielectric cut structure 702/722 may be formed by a high density plasma chemical vapor deposition (HDP-CVD), a flowable CVD (FCVD), atomic layer deposition (ALD), epitaxial deposition, plasma-enhanced chemical vapor deposition (PECVD), plasma-enhanced atomic layer deposition (PEALD), or combinations thereof, following the formation of the recess 602/622. Other insulation materials and/or other formation processes may be used, while remaining within the scope of the present disclosure.

Upon forming the mold 502/506, the mold 502/506 may be recessed (operation 212 of FIG. 2) to expose respective upper portions of the active fins 404A and 404C and an upper portion of the dielectric cut structure 702/722, in an embodiment, which will be discussed in further detail with respect to FIGS. 8A-C. In another embodiment, following the recessing process of the mold 502/506, a profile of the dielectric cut structure 702/722 can be optionally modified (operation 214 of FIG. 2), which will be discussed in further detail with respect to various examples of FIGS. 9A-C, 10A-C, 11A-C, and 12A-C, respectively. In yet another embodiment, prior to the recessing process of the mold 502/506, the dielectric cut structure 702/722 can be recessed (operation 216 of FIG. 2), which will be discussed in further detail with respect to FIGS. 13A-C, and then the mold 502/506 may be recessed (operation 218 of FIG. 2), which will be discussed in further detail with respect to FIGS. 14A-C.

Figure 8A:
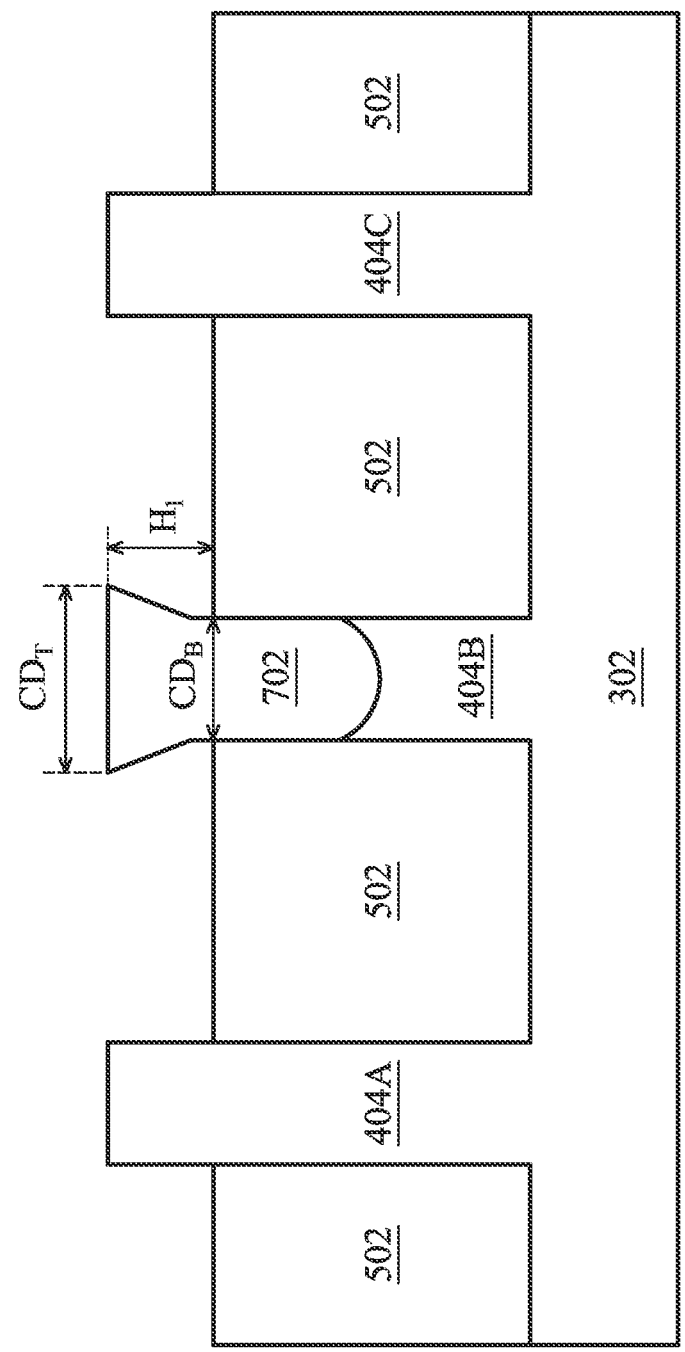
Figure 8B:
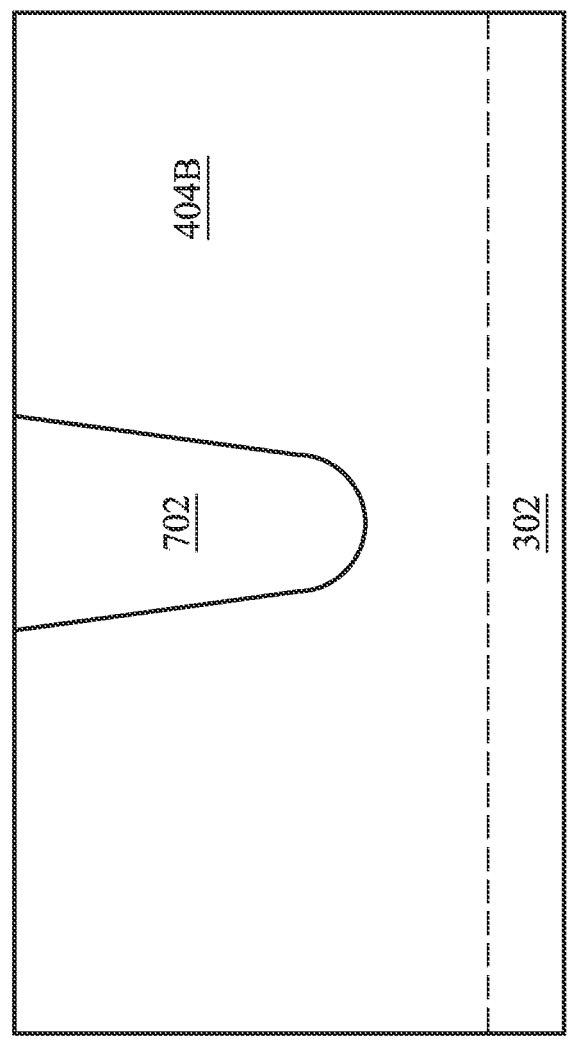
Figure 8C:
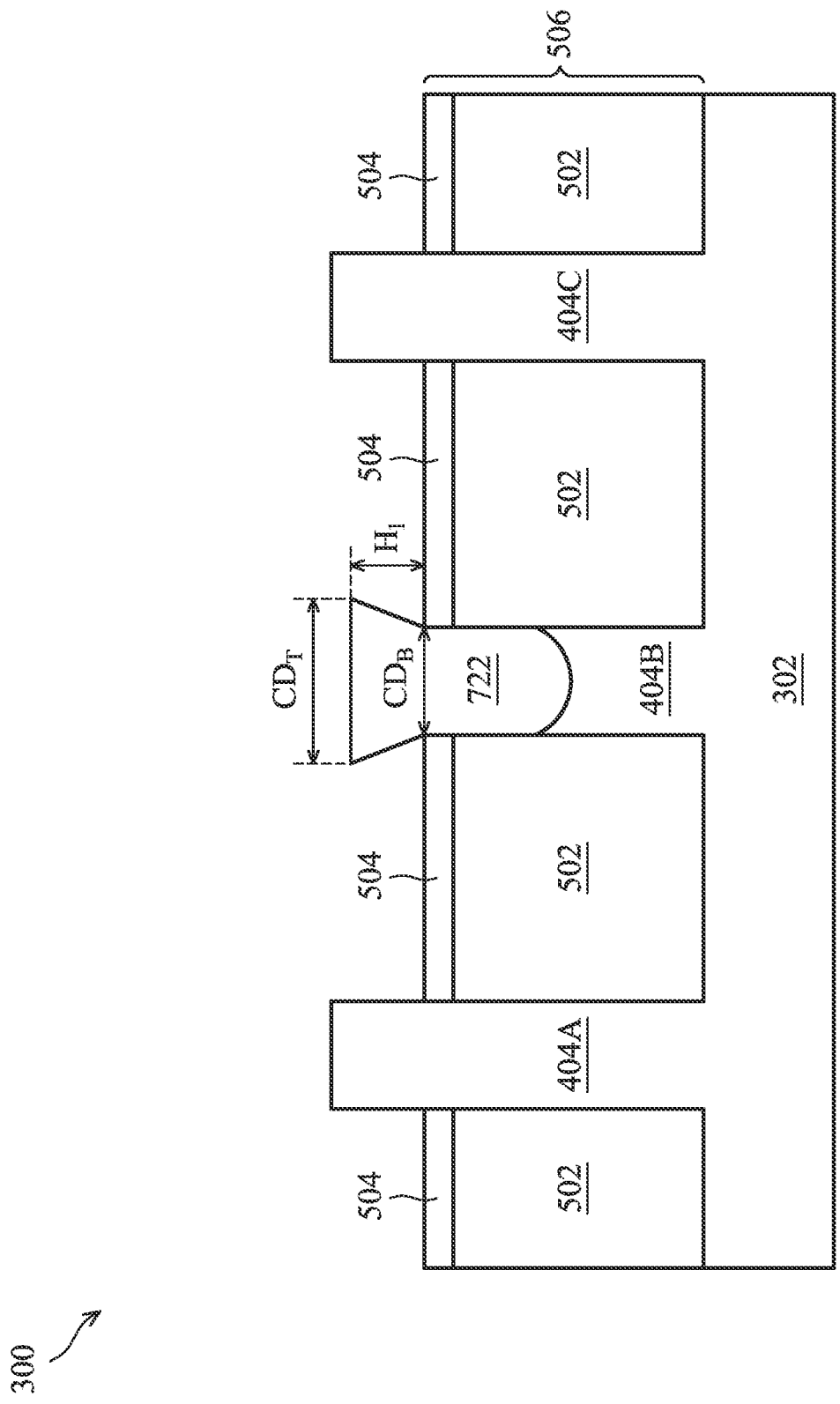

Corresponding to operation 212 of FIG. 2, FIG. 8A is a cross-sectional view of the FinFET device 300 in which the single-stack mold 502 is recessed at one of the various stages of fabrication, and FIG. 8C is a cross-sectional view of the FinFET device 300 in which the multiple-stack mold 506 is recessed at one of the various stages of fabrication. The cross-sectional views of FIGS. 8A and 8C are each cut along a direction in parallel with the lengthwise direction of an active/dummy gate structure of the FinFET device 300 (e.g., cross-section B-B indicated in FIG. 1). Corresponding to the same operation, FIG. 8B is another cross-sectional view of the FinFET device 300 cut along a lengthwise direction of the active fin, 404B (e.g., cross-section A-A indicated in FIG. 1).

In some embodiments, the mold 502/506 is recessed to form a shallow trench isolation (STI) 502/506, as shown in FIGS. 8A and 8C. The mold 502/506 is recessed such that the upper portions of the active fins 404A and 404C and the upper portion of the dielectric cut structure 702/722 can protrude from between neighboring portions of the STI 502/506. A top surface of the STI 502/506 may have a flat surface (as illustrated in FIGS. 8A and 8C), a convex surface, a concave surface (such as dishing), or combinations thereof. The top surface of the STI 502/506 may be formed flat, convex, and/or concave by an appropriate etch. In some embodiments, the profile of the dielectric cut structure 702/722 may be characterized with one or more critical dimensions (CDs). For example, the dielectric cut structure 702/722 may have a top CD ($CD_T$), which may range between about 3 nm and about 100 nm, a bottom CD ($CD_B$) level with the top surface of the mold 502/506, which may range between about 3 nm and about 100 nm, and a height $H_1$ measured from the top surface of the mold 502/506 to the top surface of the dielectric cut structure 702/722, which may be greater than about 0 nm and less than about 200 nm. In the illustrated embodiments of FIGS. 8A and 8C, the $CD_T$ is greater than the $CD_B$, but it should be understood that the $CD_T$ may be equal to or less than the $CD_B$, while remaining within the scope of the present disclosure.

The STI 502/506 may be recessed using an acceptable etching process, such as one that is selective to the material of the isolation structure 502/506 with respect to the material of the dielectric cut structure 702/722 and the material of the active fins 404A and 404C. For example, a dry etch or a wet etch using dilute hydrofluoric (DHF) acid may be performed to recess the isolation structure 502/506.

Figure 9A:
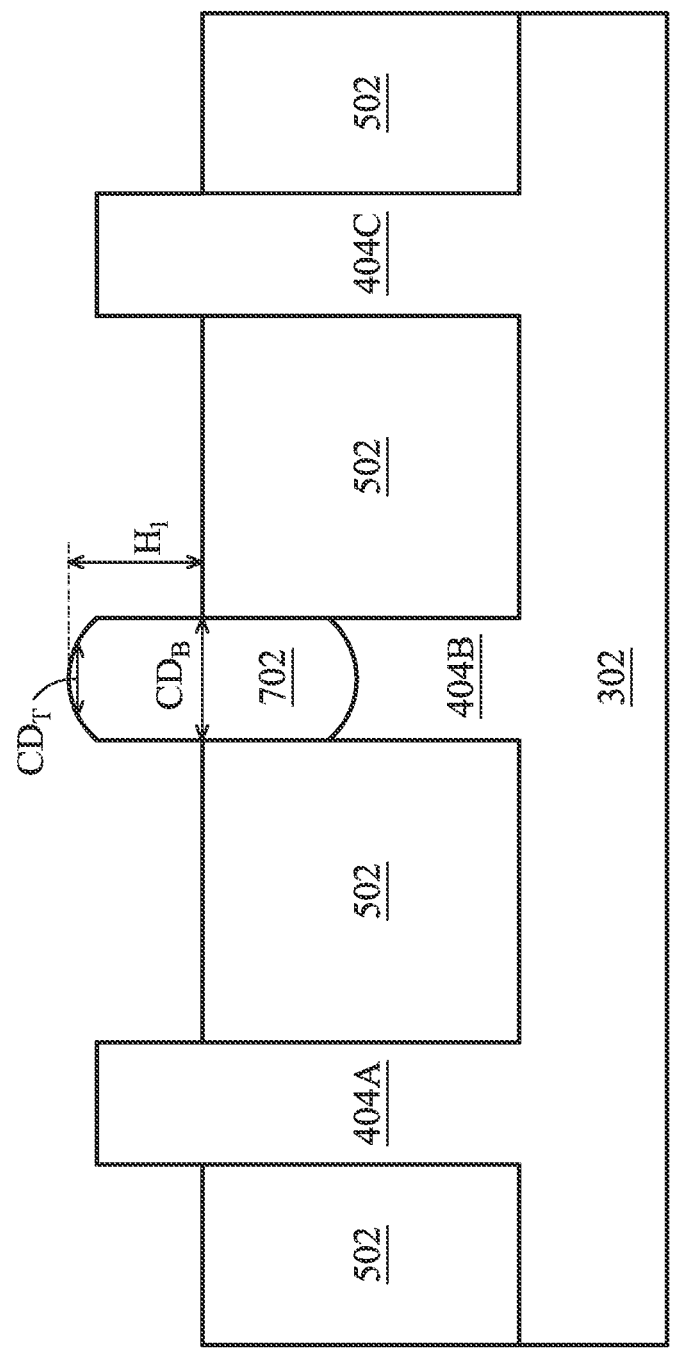
Figure 9B:
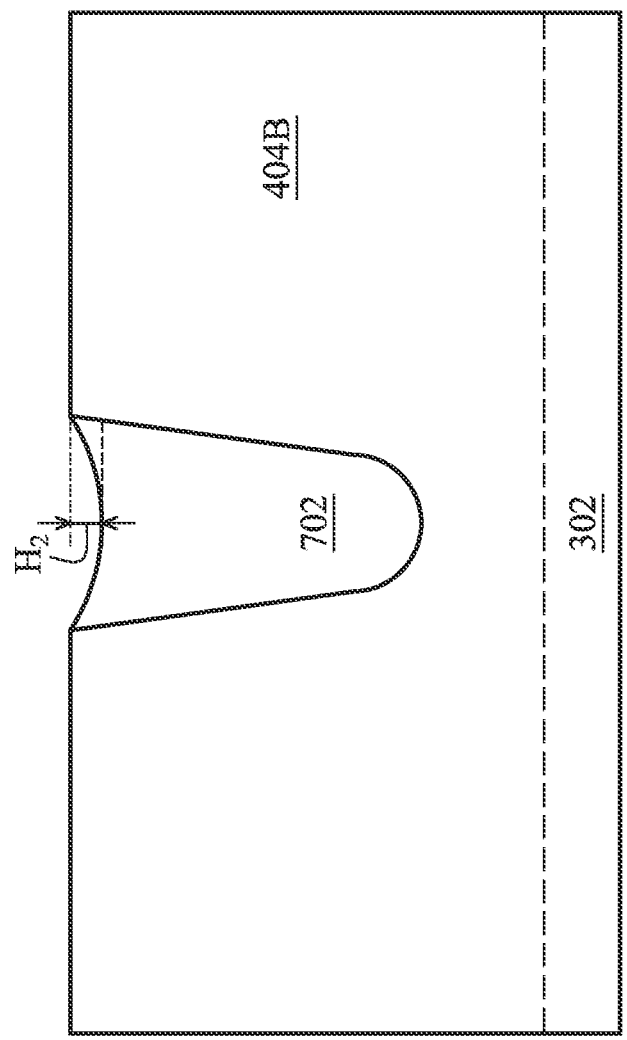
Figure 9C:
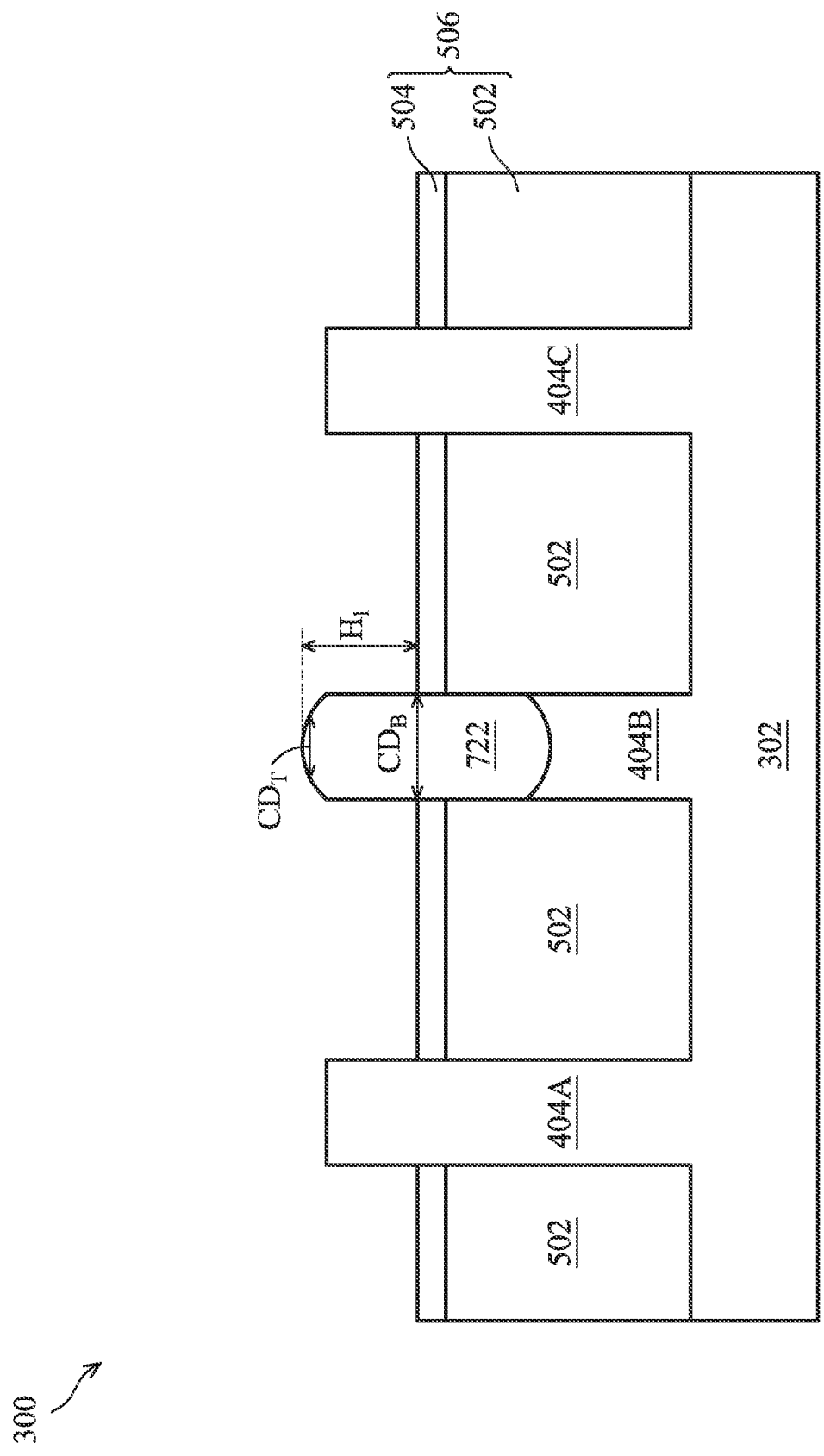

Corresponding to operation 214 of FIG. 2, FIG. 9A is a cross-sectional view of the FinFET device 300 in which a first example profile of the dielectric cut structure 702, protruding from the single-stack mold 502, is modified at one of the various stages of fabrication, and FIG. 9C is a cross-sectional view of the FinFET device 300 in which a first example profile of the dielectric cut structure 722, protruding from the multi-stack mold 506, is modified at one of the various stages of fabrication. The cross-sectional views of FIGS. 9A and 9C are each cut along a direction in parallel with the lengthwise direction of an active/dummy gate structure of the FinFET device 300 (e.g., cross-section B-B indicated in FIG. 1). Corresponding to the same operation, FIG. 9B is another cross-sectional view of the FinFET device 300 cut along a lengthwise direction of the active fin, 404B (e.g., cross-section A-A indicated in FIG. 1).

In such an example, the dielectric cut structure 702/722 may be modified to have a tapered profile, with an increasing height away from the substrate 302. Alternatively stated, the $CD_T$ may be less than the $CD_B$, as shown in FIGS. 9A and 9C. In some embodiments, the height $H_1$ may be reduced from the range previous-mentioned with respect to FIG. 8A. While modifying the profile of the dielectric cut structure 702/722 (e.g., to have a tapered profile as shown in FIGS. 9A and 9C), the top surface of the dielectric cut structure 702/722 may be recessed from a top surface of the active fin 404B, which can be characterized with a critical dimension, $H_2$, as shown in FIG. 9B. In some embodiments, $H_2$ may be greater than about 0 nm and less than about 200 nm. The profile of the dielectric cut structure 702/722 may be modified using an acceptable etching process, such as one that is selective to the material of the dielectric cut structure 702/722 with respect to the material of the isolation structure 502/506 and the material of the active fins 404A and 404C.

Figure 10A:
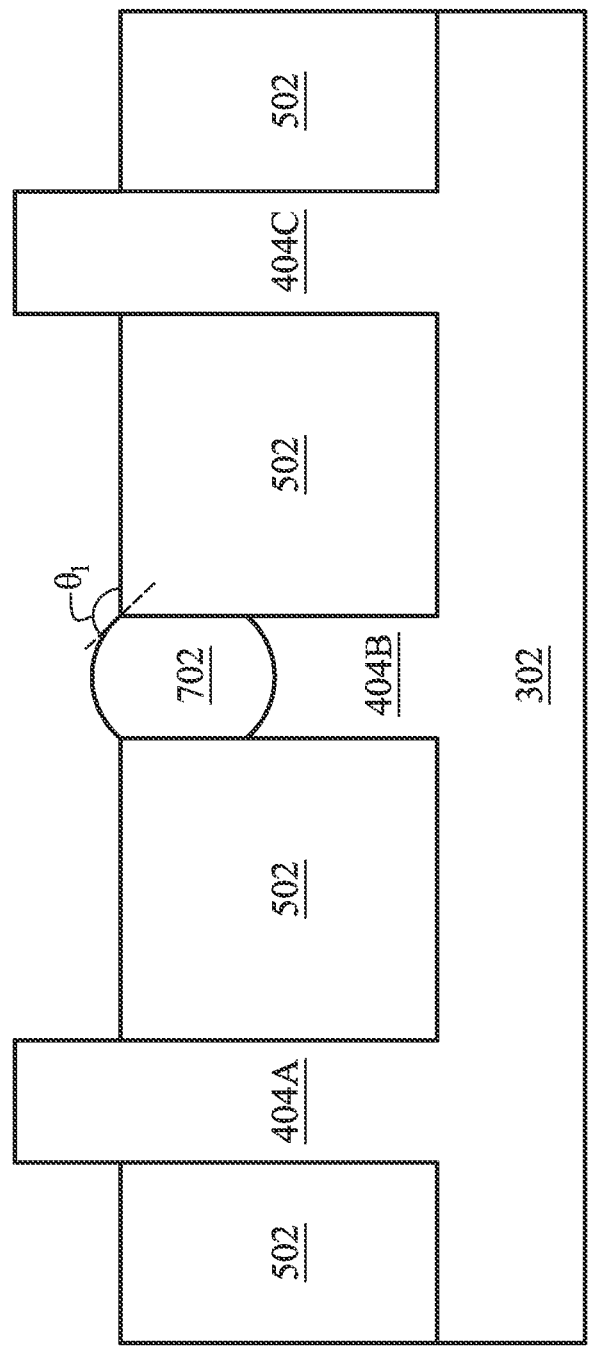
Figure 10B:
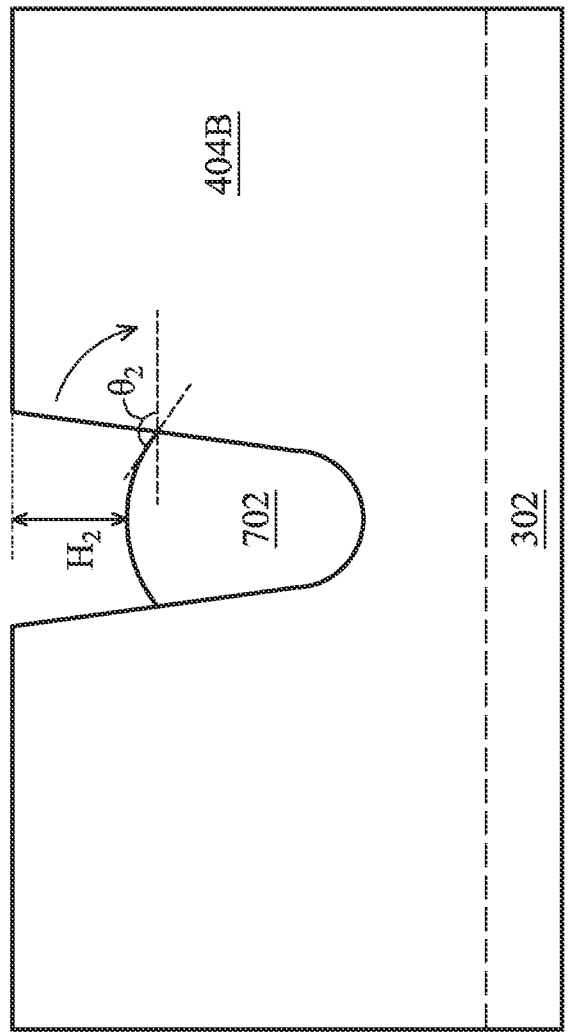
Figure 10C:
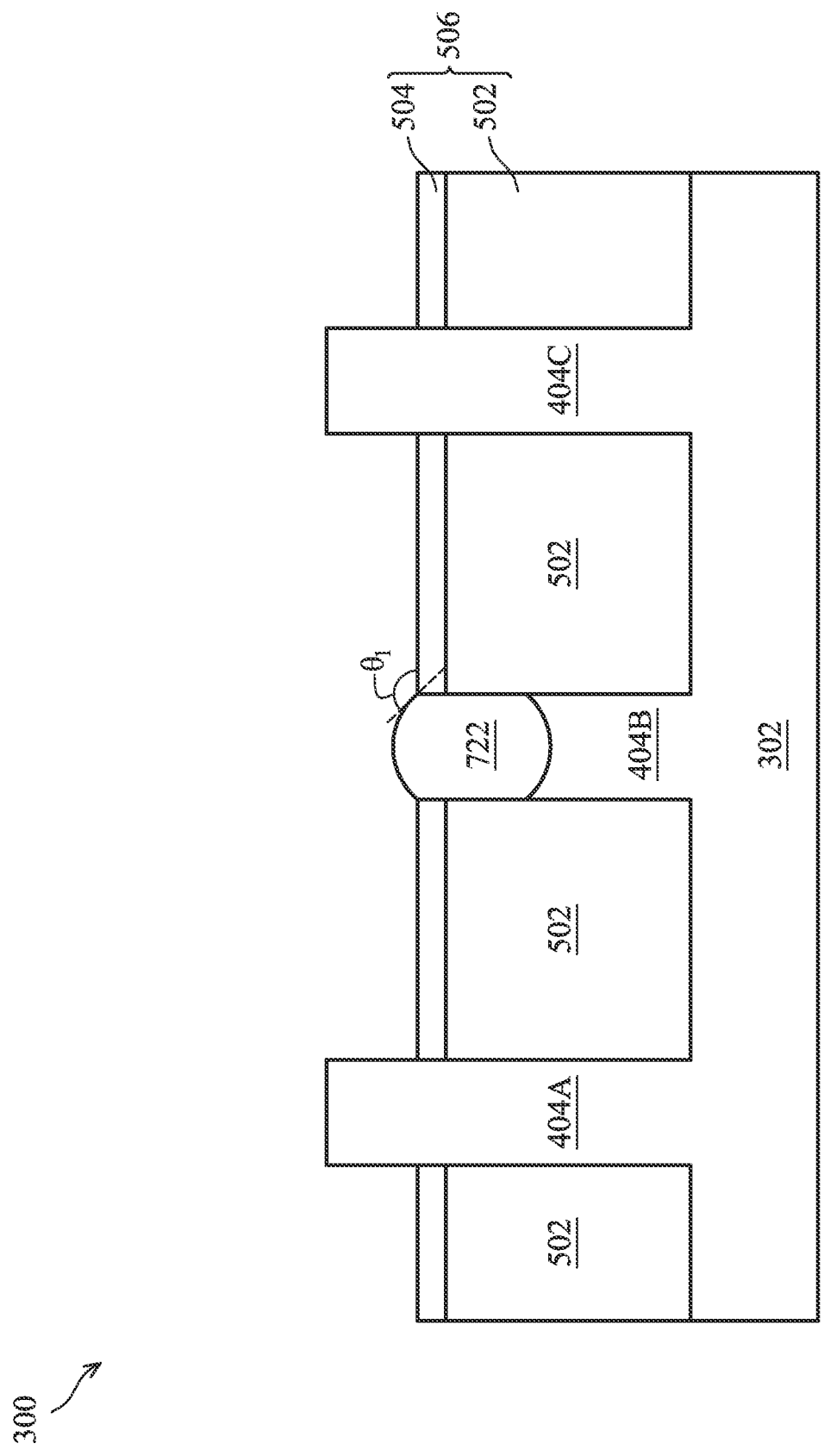

Also corresponding to operation 214 of FIG. 2, FIG. 10A is a cross-sectional view of the FinFET device 300 in which a second example profile of the dielectric cut structure 702, protruding from the single-stack mold 502, is modified at one of the various stages of fabrication, and FIG. 10C is a cross-sectional view of the FinFET device 300 in which a second example profile of the dielectric cut structure 722, protruding from the multi-stack mold 506, is modified at one of the various stages of fabrication. The cross-sectional views of FIGS. 10A and 10C are each cut along a direction in parallel with the lengthwise direction of an active/dummy gate structure of the FinFET device 300 (e.g., cross-section B-B indicated in FIG. 1). Corresponding to the same operation, FIG. 10B is another cross-sectional view of the FinFET device 300 cut along a lengthwise direction of the active fin, 404B (e.g., cross-section A-A indicated in FIG. 1).

In such an example, the dielectric cut structure 702/722 may be modified to have a convex profile, as shown in FIGS. 10A and 10C. With this convex profile, an angle, θ1, formed between the top surface of the dielectric cut structure 702/722 and the top surface of the mold 502/506 may vary from about 95° to about 178° while running along the top surface of the dielectric cut structure 702/722. While modifying the profile of the dielectric cut structure 702/722 (e.g., to have a convex profile as shown in FIGS. 10A and 10C), the top surface of the dielectric cut structure 702/722 may be recessed from a top surface of the active fin 404B, as shown in FIG. 10B. The top surface of the dielectric cut structure 702/722 may be recessed from the top surface of the active fin 404B, which can be characterized with the H2 that may be greater than about 0 nm and less than about 200 nm. In some embodiments, an angle, θ2, formed between the top surface of the dielectric cut structure 702/722 and a projection of the top surface of the active fin 404B may vary from about 95° to about 178° while running along the top surface of the dielectric cut structure 702/722. The profile of the dielectric cut structure 702/722 may be modified using an acceptable etching process, such as one that is selective to the material of the dielectric cut structure 702/722 with respect to the material of the isolation structure 502/506 and the material of the active fins 404A and 404C.

Figure 11A:
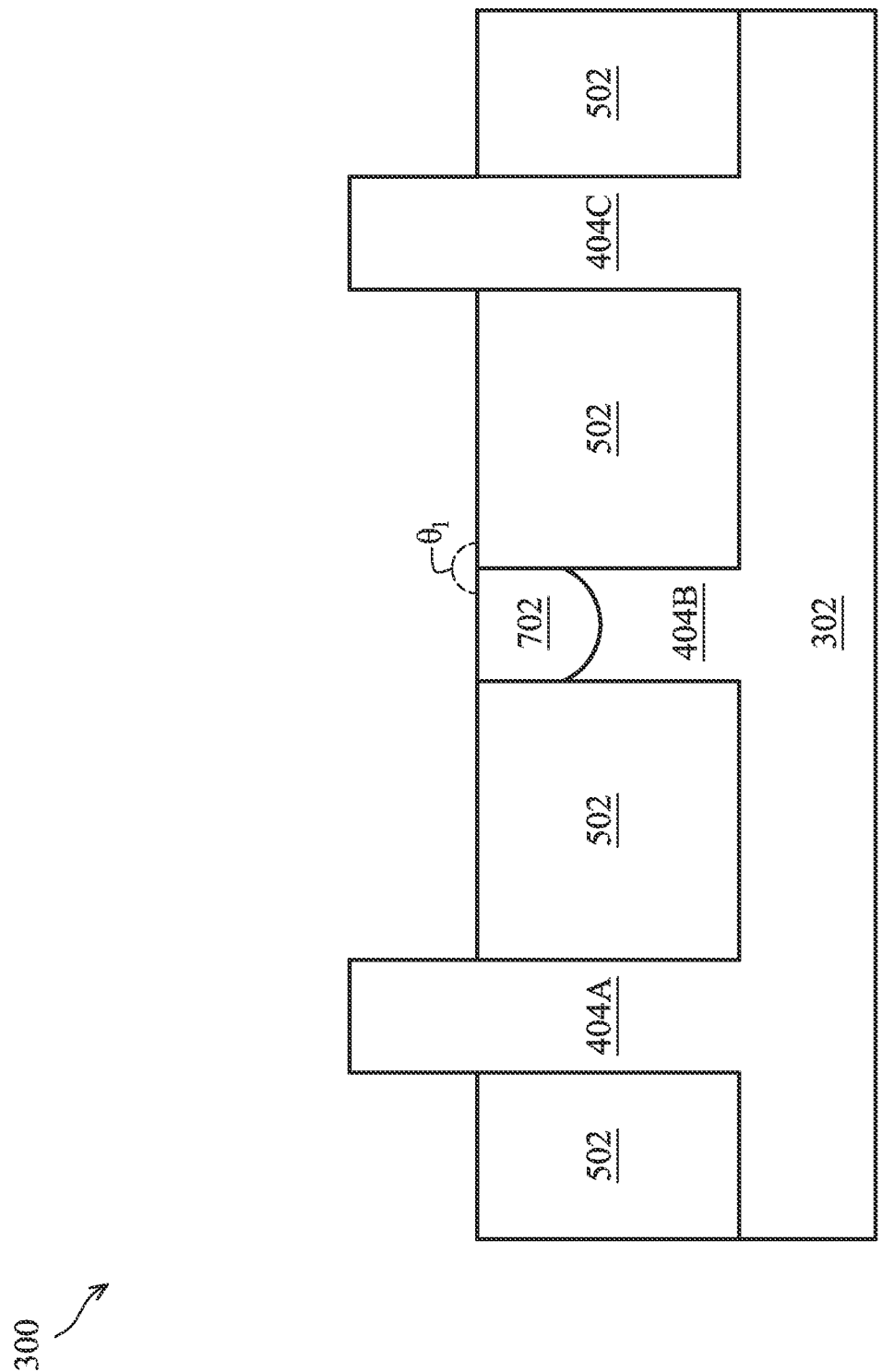
Figure 11B:
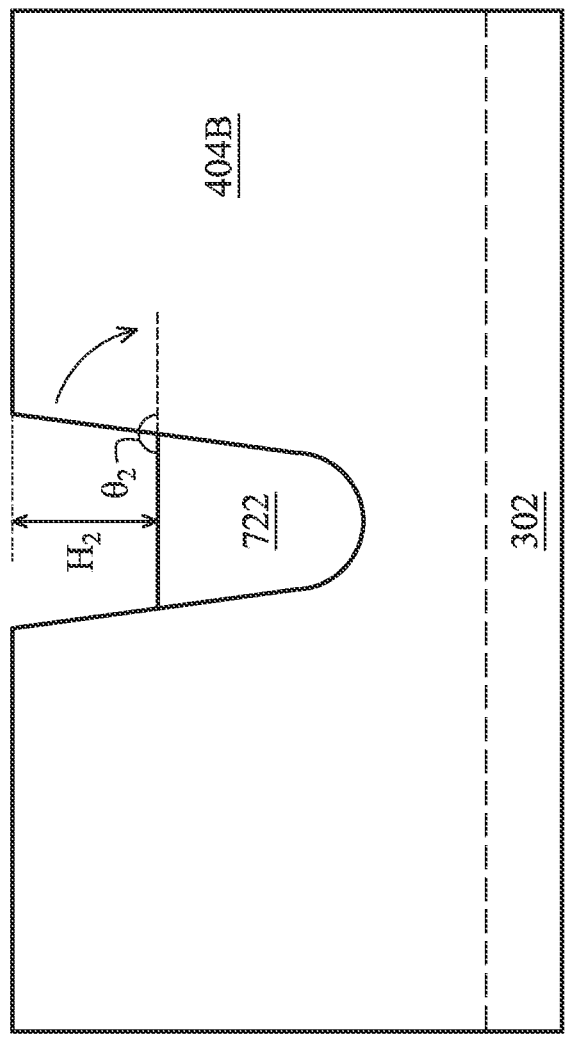
Figure 11C:
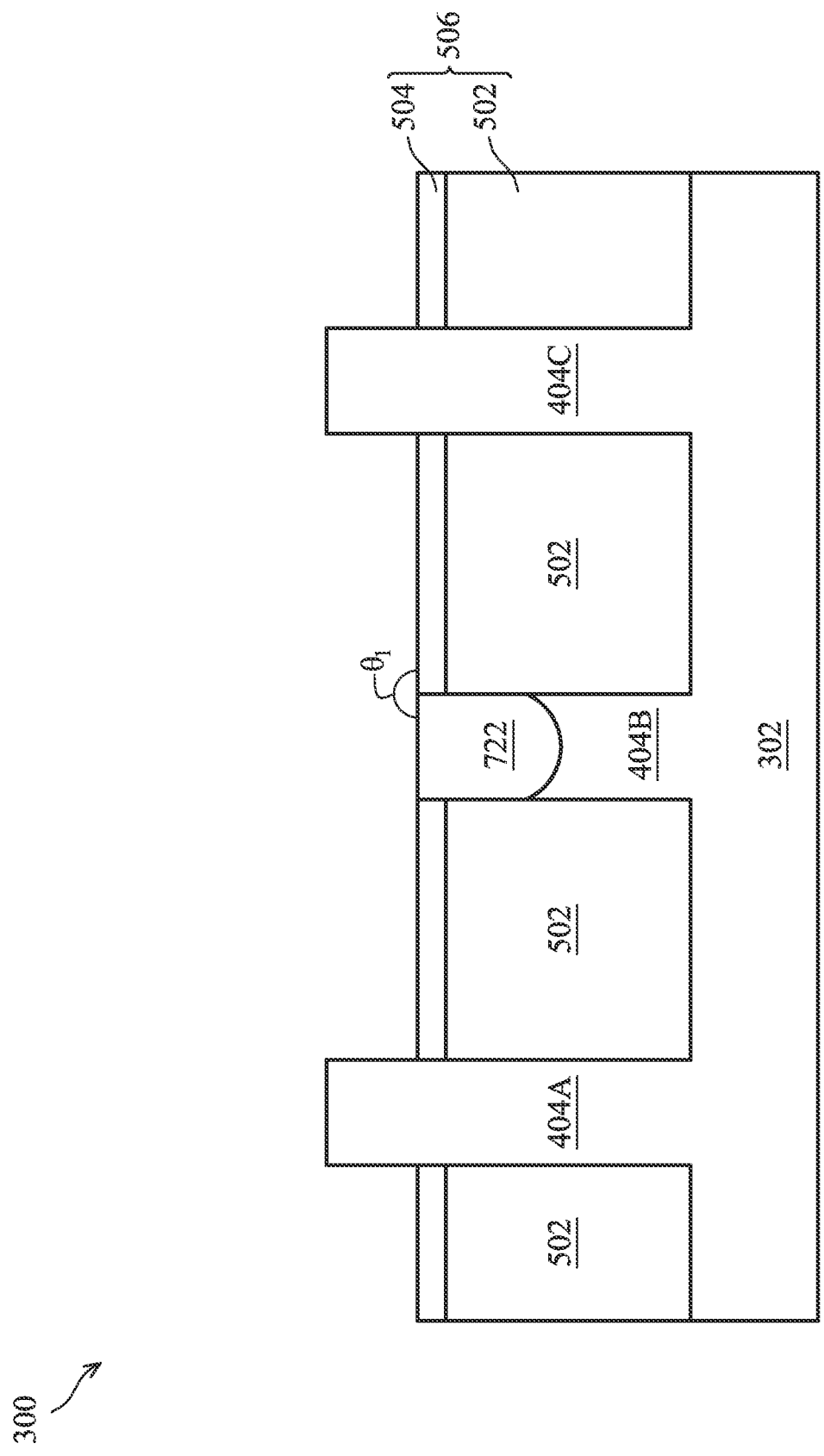

Also corresponding to operation 214 of FIG. 2, FIG. 11A is a cross-sectional view of the FinFET device 300 in which a third example profile of the dielectric cut structure 702, embedded in the single-stack mold 502, is modified at one of the various stages of fabrication, and FIG. 11C is a cross-sectional view of the FinFET device 300 in which a third example profile of the dielectric cut structure 722, embedded in the multi-stack mold 506, is modified at one of the various stages of fabrication. The cross-sectional views of FIGS. 11A and 11C are each cut along a direction in parallel with the lengthwise direction of an active/dummy gate structure of the FinFET device 300 (e.g., cross-section B-B indicated in FIG. 1). Corresponding to the same operation, FIG. 11B is another cross-sectional view of the FinFET device 300 cut along a lengthwise direction of the active fin, 404B (e.g., cross-section A-A indicated in FIG. 1).

In such an example, the dielectric cut structure 702/722 may be modified to have a relatively flat profile, as shown in FIGS. 11A and 11C. With this flat profile, the angle θ1 may be between about 178° and about 182°. While modifying the profile of the dielectric cut structure 702/722 (e.g., to have a flat profile as shown in FIGS. 11A and 11C), the top surface of the dielectric cut structure 702/722 may be recessed from a top surface of the active fin 404B, as shown in FIG. 11B. The top surface of the dielectric cut structure 702/722 may be recessed from the top surface of the active fin 404B, which can be characterized with the H2 that may be greater than about 0 nm and less than about 200 nm. In some embodiments, the angle θ2 may be between about 178° and about 182°. The profile of the dielectric cut structure 702/722 may be modified using an acceptable etching process, such as one that is selective to the material of the dielectric cut structure 702/722 with respect to the material of the isolation structure 502/506 and the material of the active fins 404A and 404C.

Figure 12A:
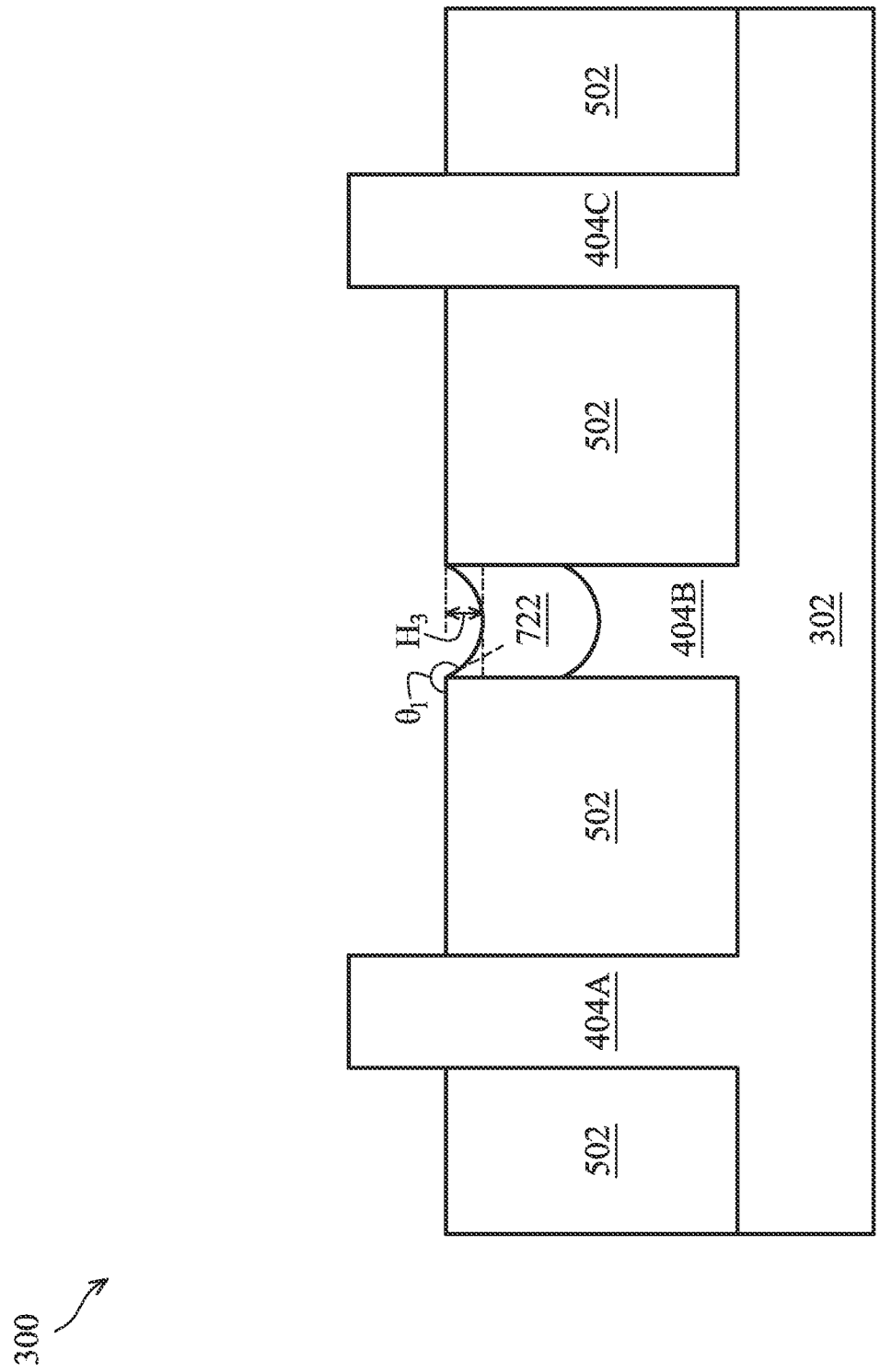
Figure 12B:
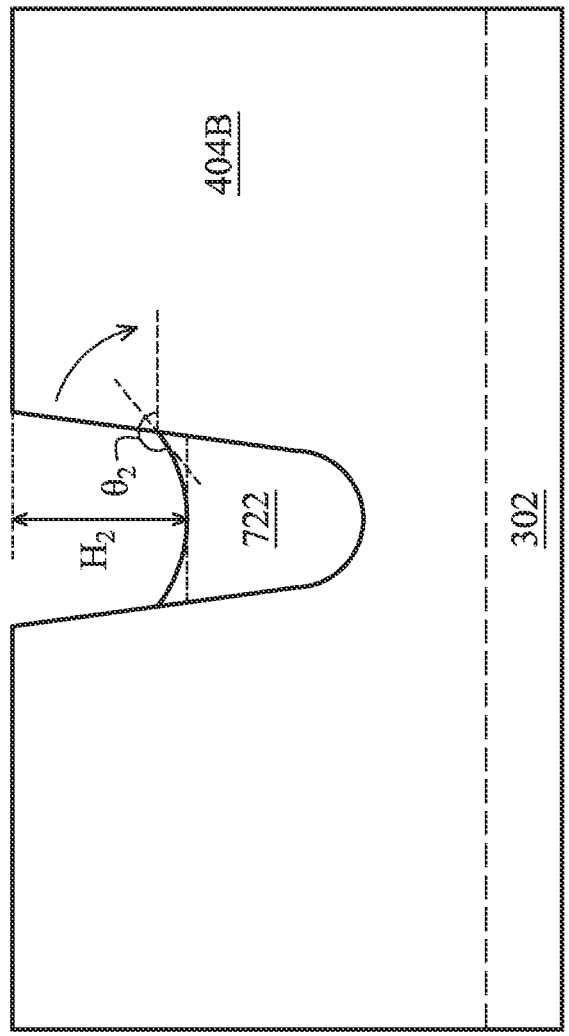
Figure 12C:
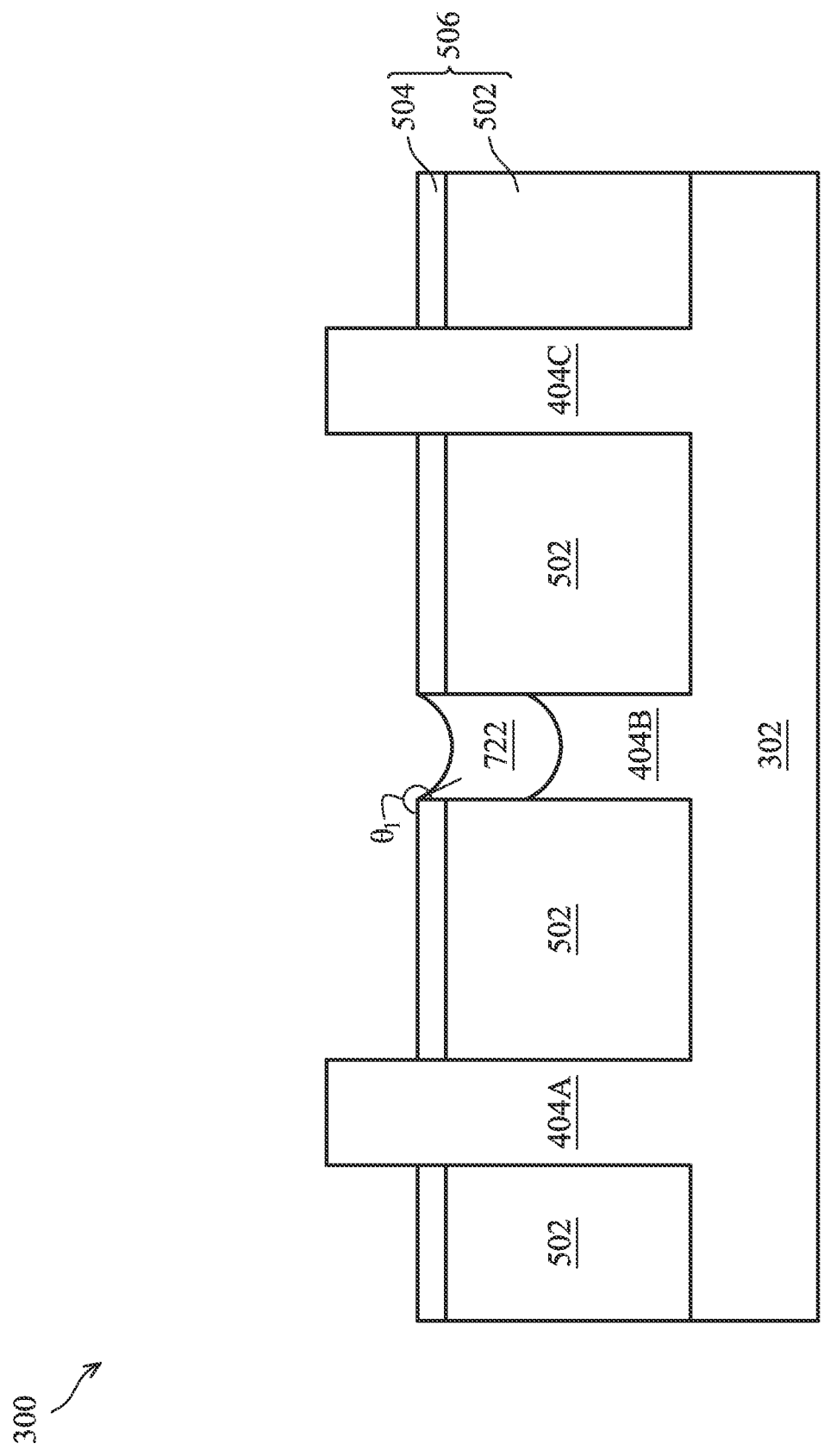

Also corresponding to operation 214 of FIG. 2, FIG. 12A is a cross-sectional view of the FinFET device 300 in which a fourth example profile of the dielectric cut structure 702, embedded in the single-stack mold 502, is modified at one of the various stages of fabrication, and FIG. 12C is a cross-sectional view of the FinFET device 300 in which a fourth example profile of the dielectric cut structure 722, embedded in the multi-stack mold 506, is modified at one of the various stages of fabrication. The cross-sectional views of FIGS. 12A and 12C are each cut along a direction in parallel with the lengthwise direction of an active/dummy gate structure of the FinFET device 300 (e.g., cross-section B-B indicated in FIG. 1). Corresponding to the same operation, FIG. 12B is another cross-sectional view of the FinFET device 300 cut along a lengthwise direction of the active fin, 404B (e.g., cross-section A-A indicated in FIG. 1).

In such an example, the dielectric cut structure 702/722 may be modified to have a concave profile, as shown in FIGS. 12A and 12C. With this concave profile, the top surface of the dielectric cut structure 702/722 may be recessed from the top surface of the mold 502/506, which can be characterized with a depth $H_3$ that may be greater than about 0 nm and less than about 100 nm. The angle $θ_1$ may vary from about 182° to about 268° while running along the top surface of the dielectric cut structure 702/722. While modifying the profile of the dielectric cut structure 702/722 (e.g., to have a concave profile as shown in FIGS. 12A and 12C), the top surface of the dielectric cut structure 702/722 may be recessed from a top surface of the active fin 404B, as shown in FIG. 12B. The top surface of the dielectric cut structure 702/722 may be recessed from the top surface of the active fin 404B, which can be characterized with the $H_2$ that may be greater than about 0 nm and less than about 200 nm. In some embodiments, the angle $θ_2$ may vary from about 182° to about 268° while running along the top surface of the dielectric cut structure 702/722. The profile of the dielectric cut structure 702/722 may be modified using an acceptable etching process, such as one that is selective to the material of the dielectric cut structure 702/722 with respect to the material of the isolation structure 502/506 and the material of the active fins 404A and 404C.

Figure 13A:
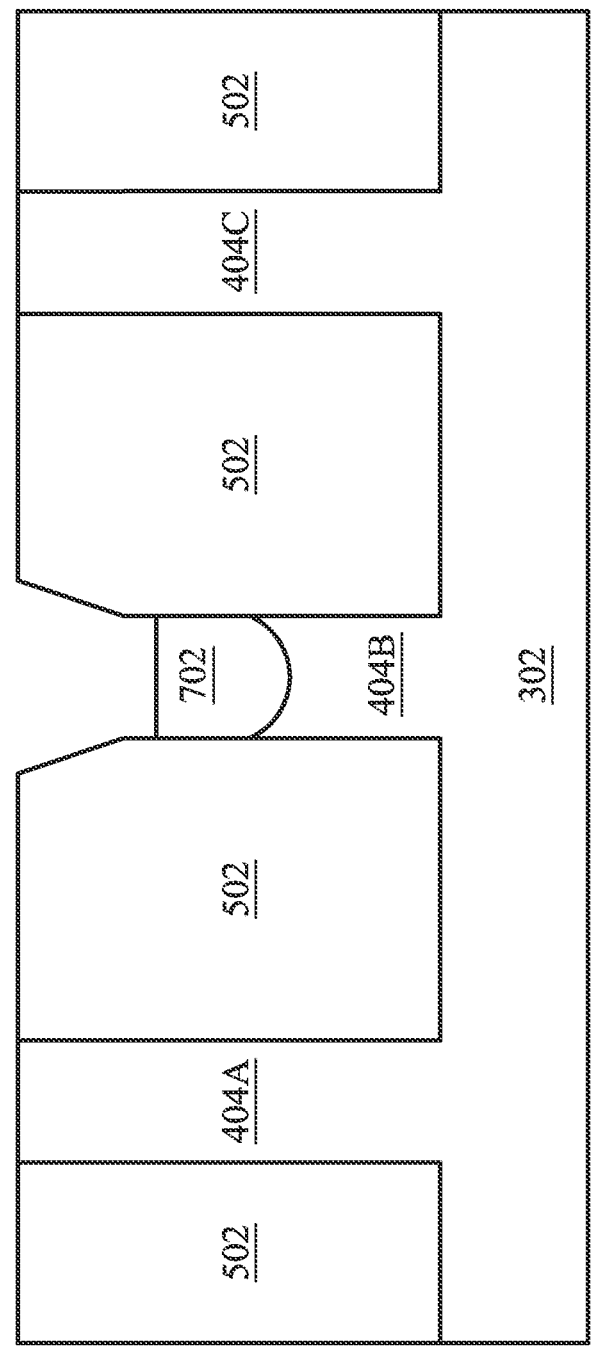
Figure 13B:
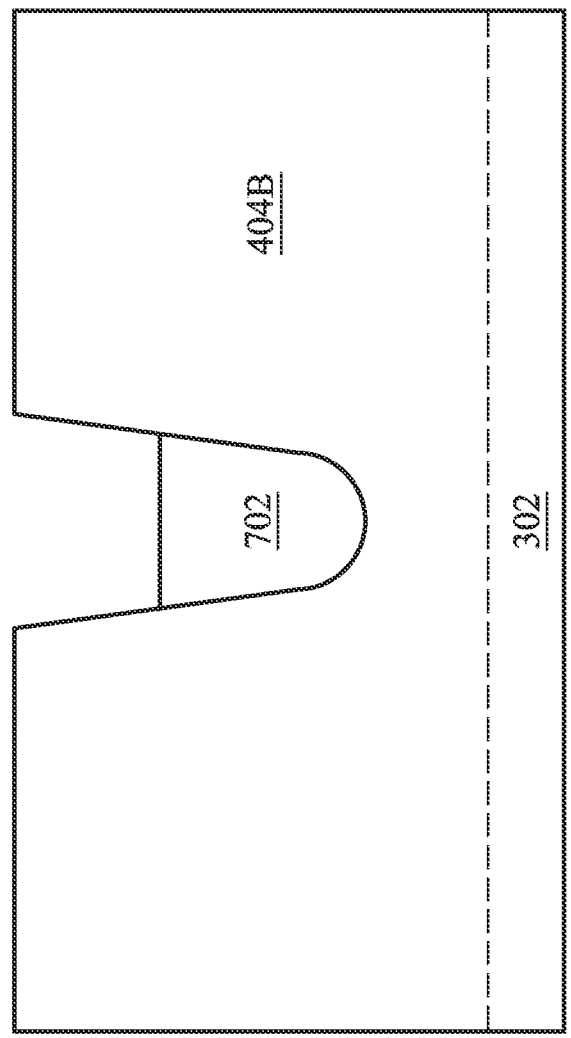
Figure 13C:
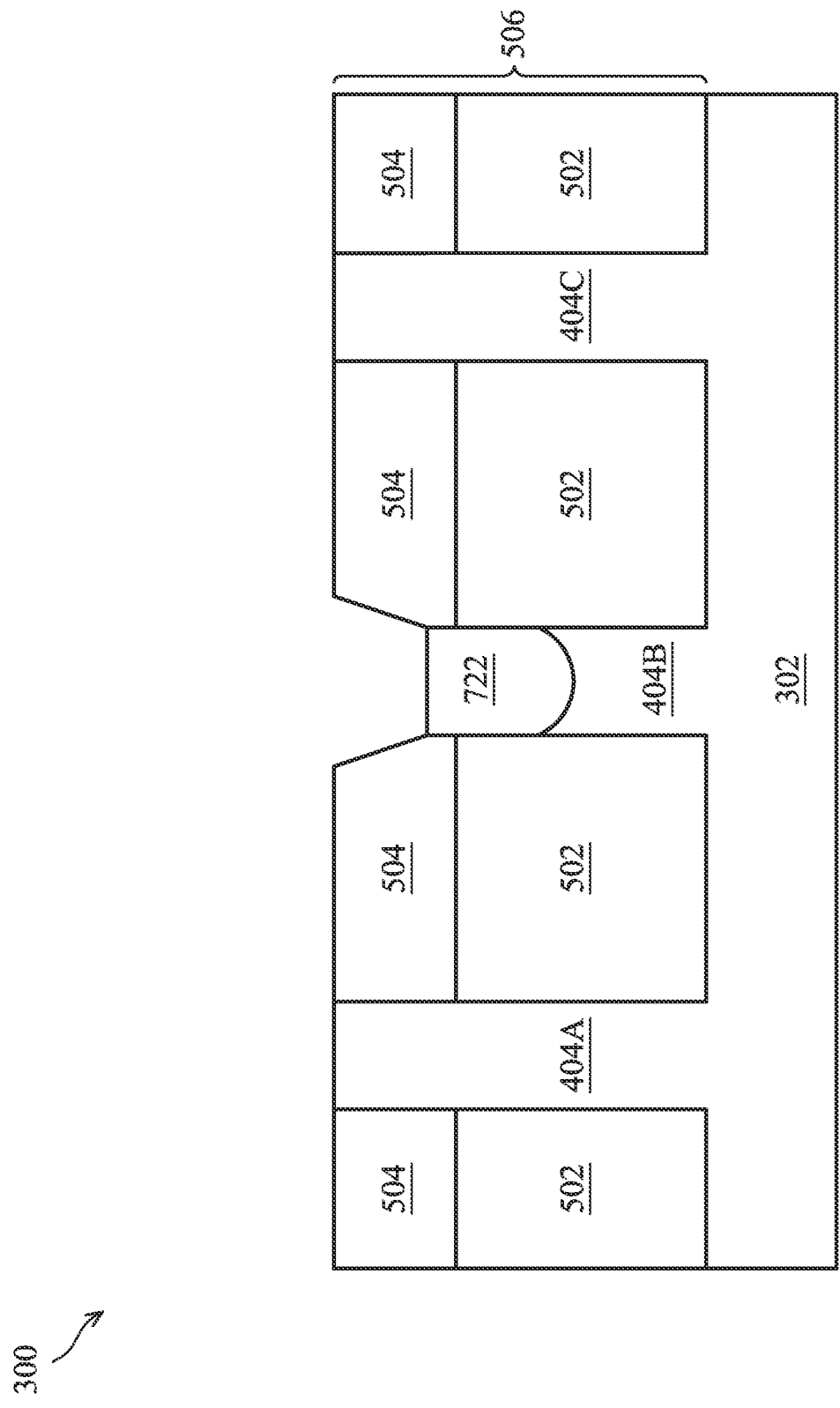

Corresponding to operation 216 of FIG. 2, FIG. 13A is a cross-sectional view of the FinFET device 300 in which the dielectric cut structure 702 is recessed at one of the various stages of fabrication, and FIG. 13C is a cross-sectional view of the FinFET device 300 in which the dielectric cut structure 722 is recessed at one of the various stages of fabrication. The cross-sectional views of FIGS. 13A and 13C are each cut along a direction in parallel with the lengthwise direction of an active/dummy gate structure of the FinFET device 300 (e.g., cross-section B-B indicated in FIG. 1). Corresponding to the same operation, FIG. 13B is another cross-sectional view of the FinFET device 300 cut along a lengthwise direction of the active fin, 404B (e.g., cross-section A-A indicated in FIG. 1).

Prior to recessing the mold 502/506, the dielectric cut structure 702/722 may be recessed, in some embodiments. The dielectric cut structure 702/722 may be recessed using an acceptable etching process, such as one that is selective to the material of the dielectric cut structure 702/722 and the material of the active fins 404A and 404C with respect to the material of the isolation structure 502/506. Although the recessed dielectric cut structure 702/722 has a relatively flat top surface in the illustrated embodiments of FIGS. 13A-C, it should be understood that the top surface of the recessed dielectric cut structure 702/722 can be convex, concave, or otherwise curvature-based, while remaining within the scope of the present disclosure.

Figure 14A:
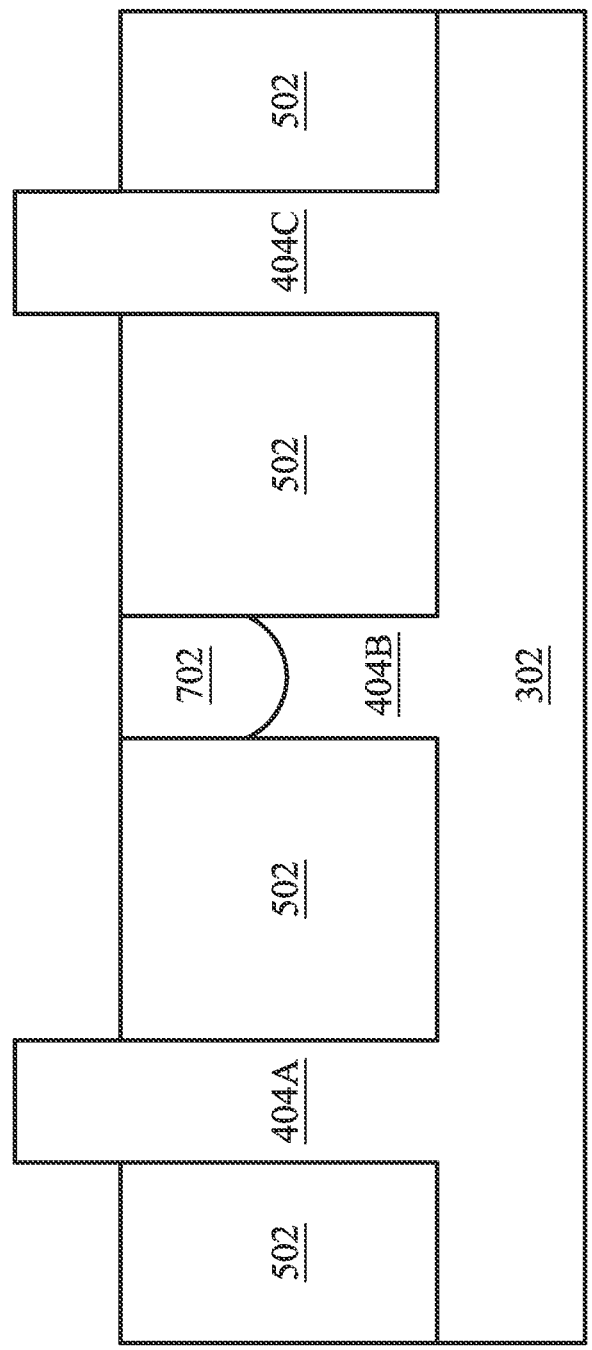
Figure 14B:
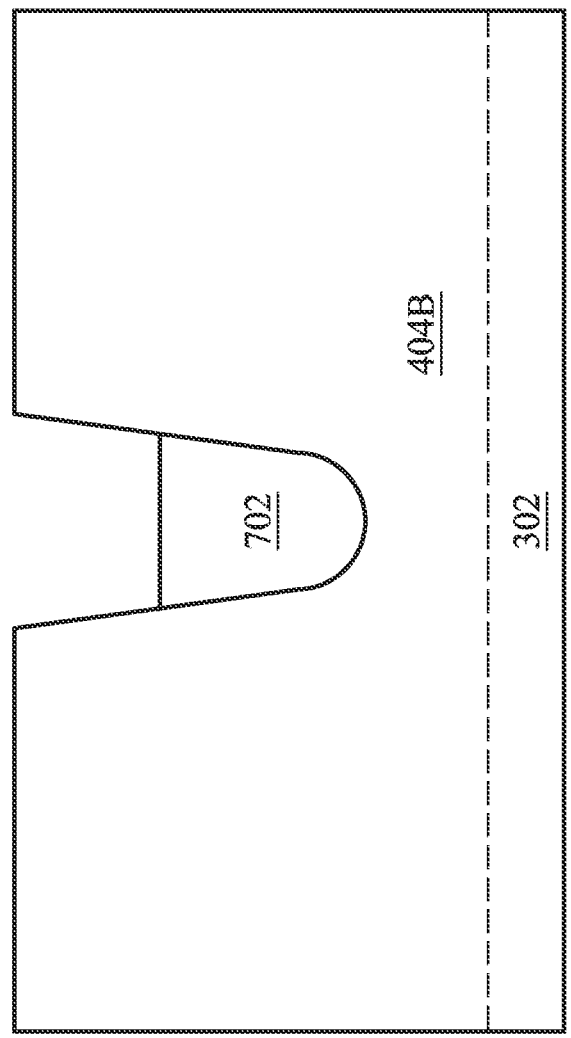
Figure 14C:
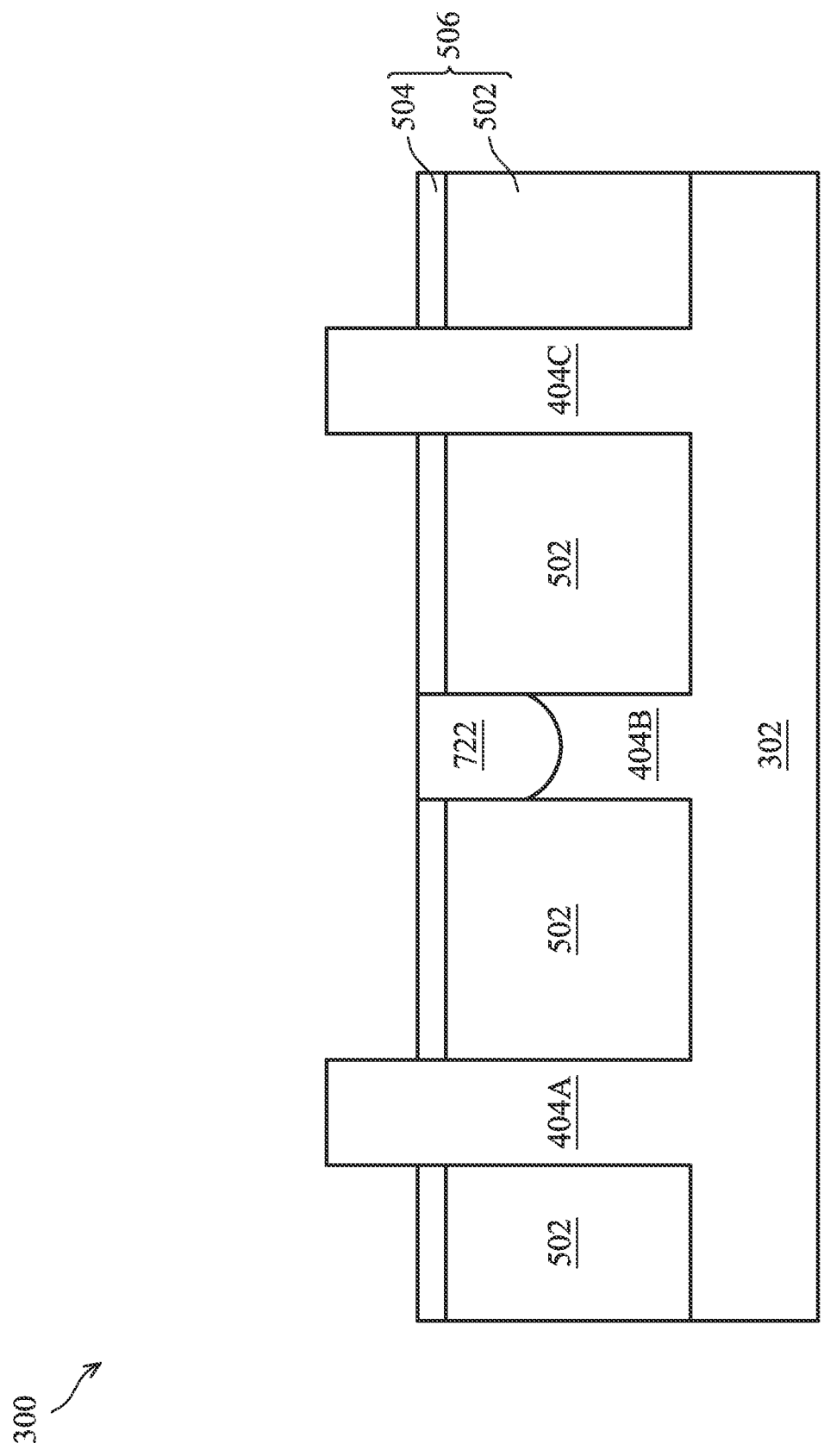

Corresponding to operation 218 of FIG. 2, FIG. 14A is a cross-sectional view of the FinFET device 300 in which the mold 502 is recessed at one of the various stages of fabrication, and FIG. 14C is a cross-sectional view of the FinFET device 300 in which the mold 506 is recessed at one of the various stages of fabrication. The cross-sectional views of FIGS. 14A and 14C are each cut along a direction in parallel with the lengthwise direction of an active/dummy gate structure of the FinFET device 300 (e.g., cross-section B-B indicated in FIG. 1). Corresponding to the same operation, FIG. 14B is another cross-sectional view of the FinFET device 300 cut along a lengthwise direction of the active fin, 404B (e.g., cross-section A-A indicated in FIG. 1).

Following the step of recessing the dielectric cut structure 702/722, the mold 502/506 may be recessed to cause the top surfaces of the mold 502/506 and the recessed dielectric cut structure 702/722 to be substantially coplanar. As such, the respective upper portions of the active fins 404A and 404C can protrude from between neighboring (recessed) mold 502/506, thereby forming STIs 502/506, as shown in FIGS. 14A and 14C. The STI 502/506 may be recessed using an acceptable etching process, such as one that is selective to the material of the isolation structure 502/506 with respect to the material of the dielectric cut structure 702/722 and the material of the active fins 404A and 404C. For example, a dry etch or a wet etch using dilute hydrofluoric (DHF) acid may be performed to recess the mold 502/506.

Upon recessing the mold 502/506 to form the STIs, a number of dummy gate structures, following the footprints 610 and 620 (FIG. 6C), may be formed. Such dummy gate structures generally extend along a direction perpendicular to the lengthwise directions of the active fins, such that each of the dummy gate structures can straddle a respective portion of each of the active fins 404A-C. Following the formation of the dummy gate structures (and corresponding gate spacers on opposite sides of each dummy gate structure), a number of source/drain structures/regions can be formed in each of the active fins 404A-C. The source/drain structures are formed on the opposite sides of each dummy gate structure, with the corresponding gate spacer disposed therebetween. Next, an interlayer dielectric (ILD) is formed over the source/drain structures. Next, the dummy gate structures are removed to form respectively gate trenches, which are then filled by a number of active (e.g., metal) gate structures.

Figure 15A:
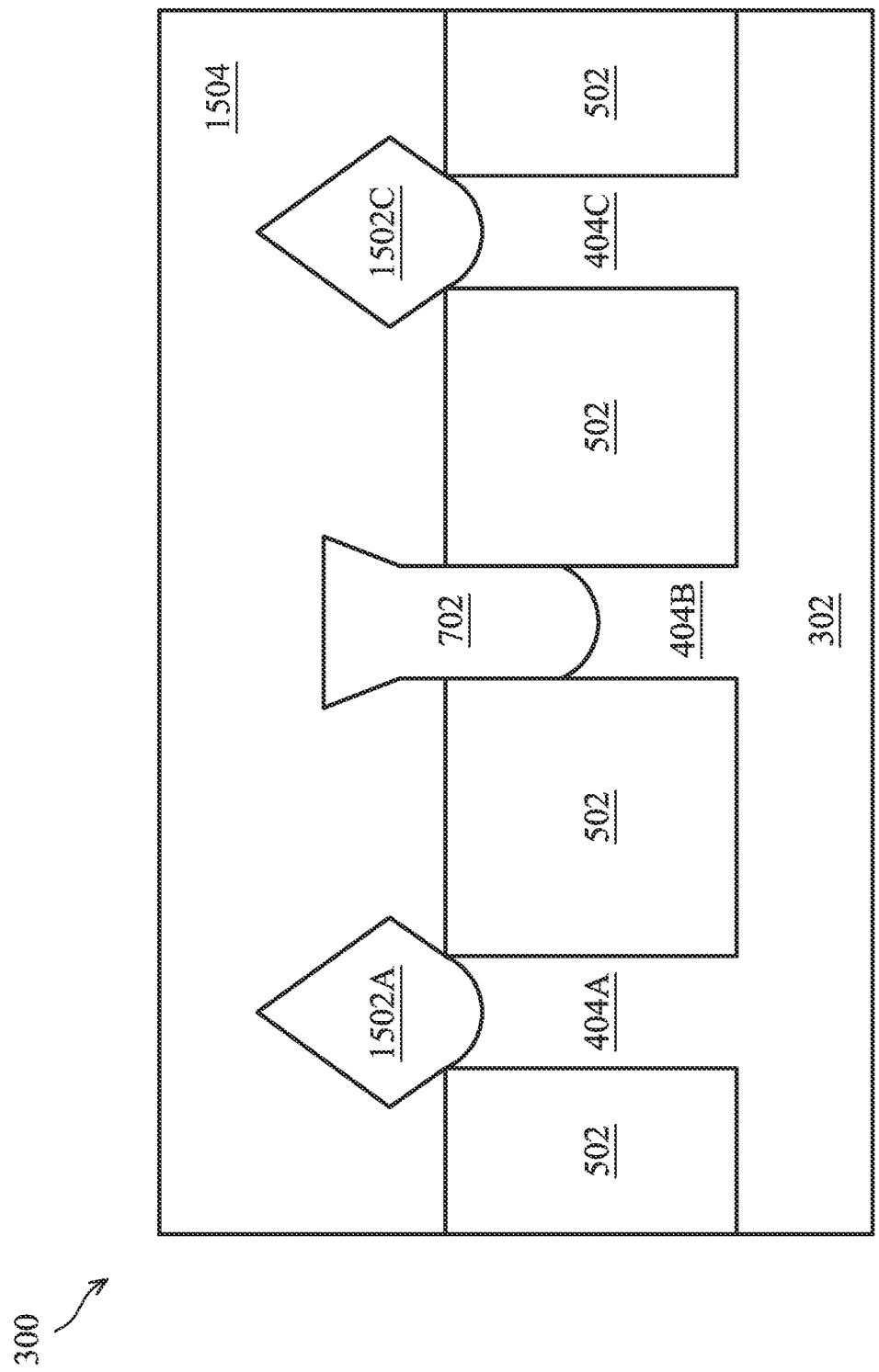
Figure 15B:
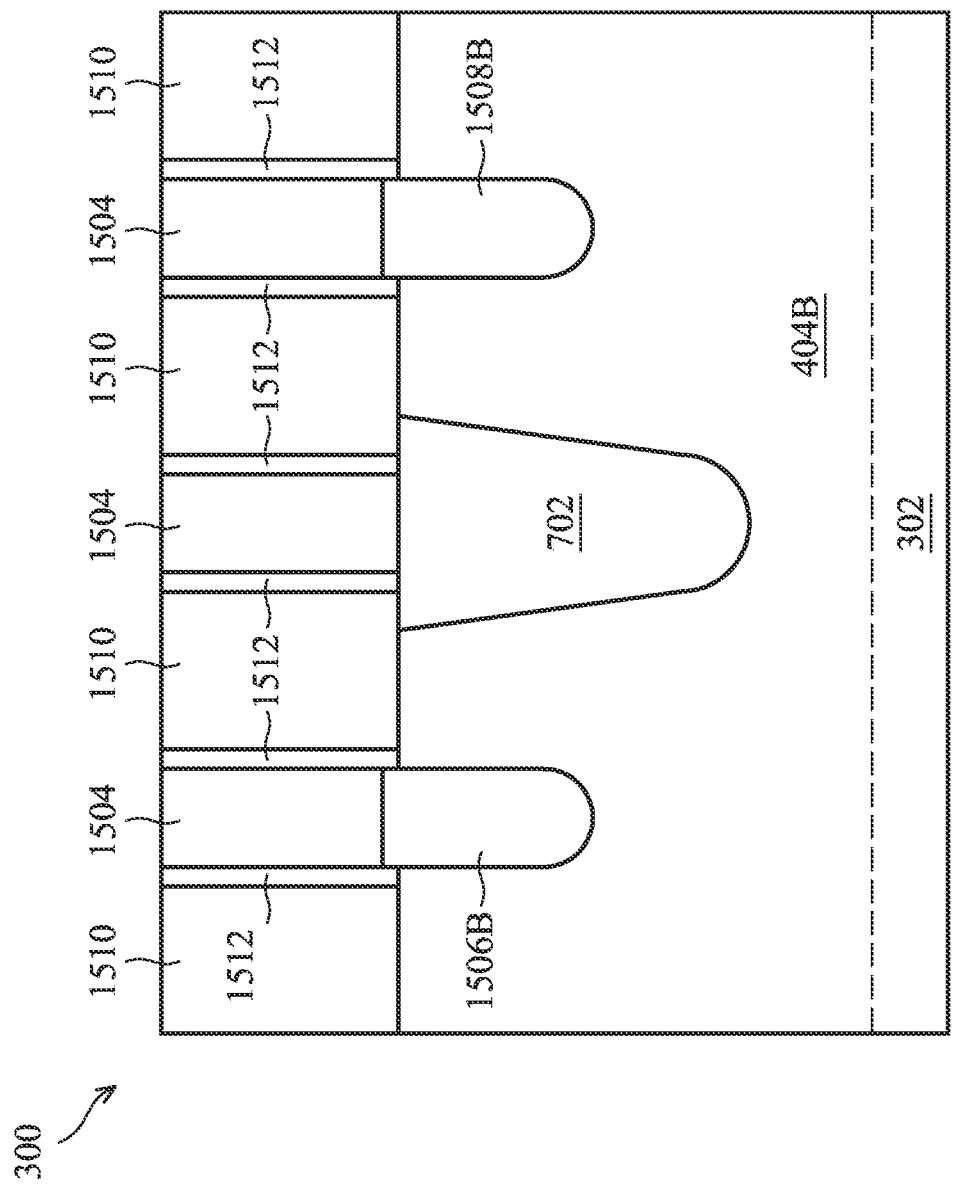
Figure 15C:
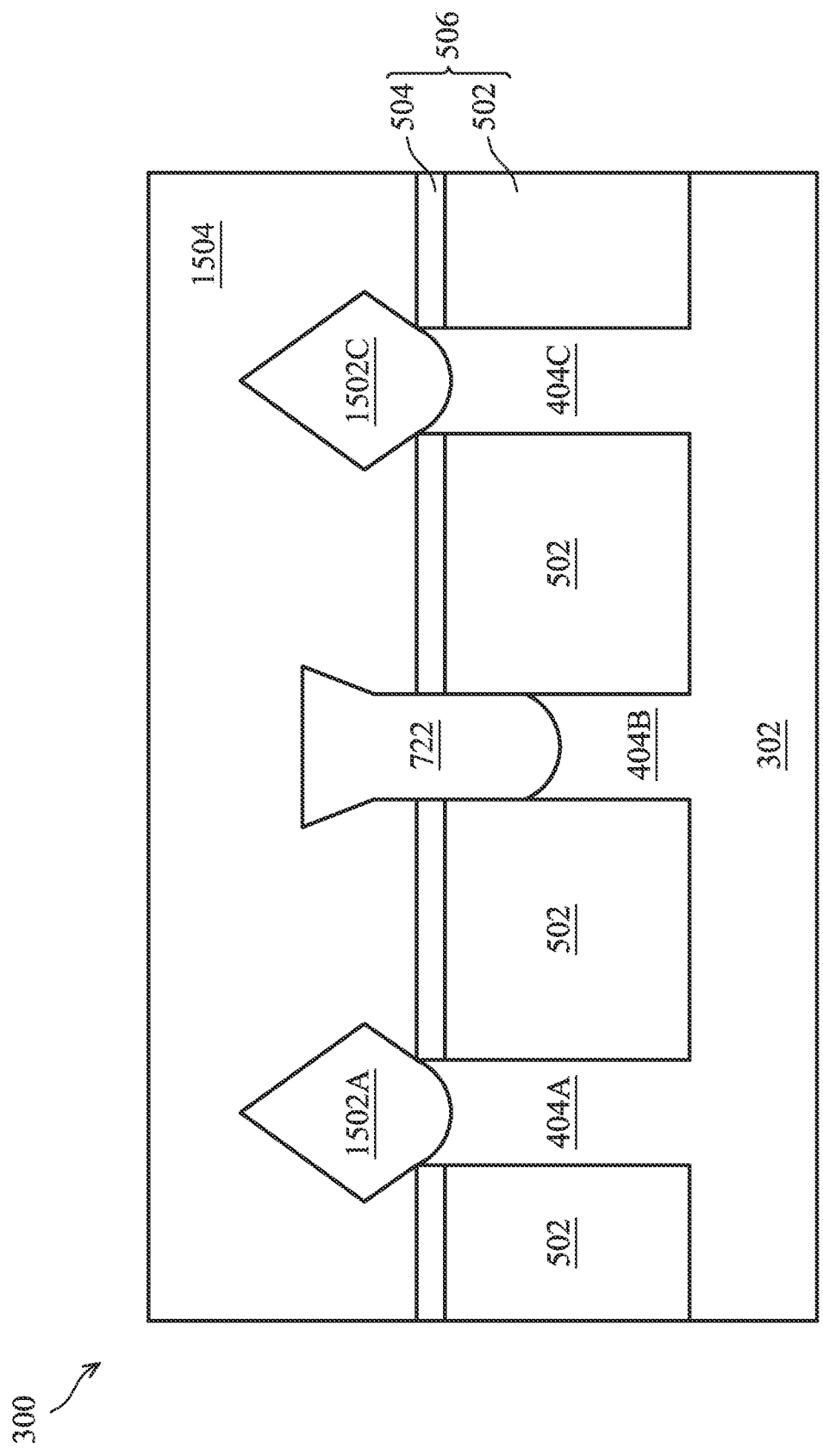
Figure 16A:
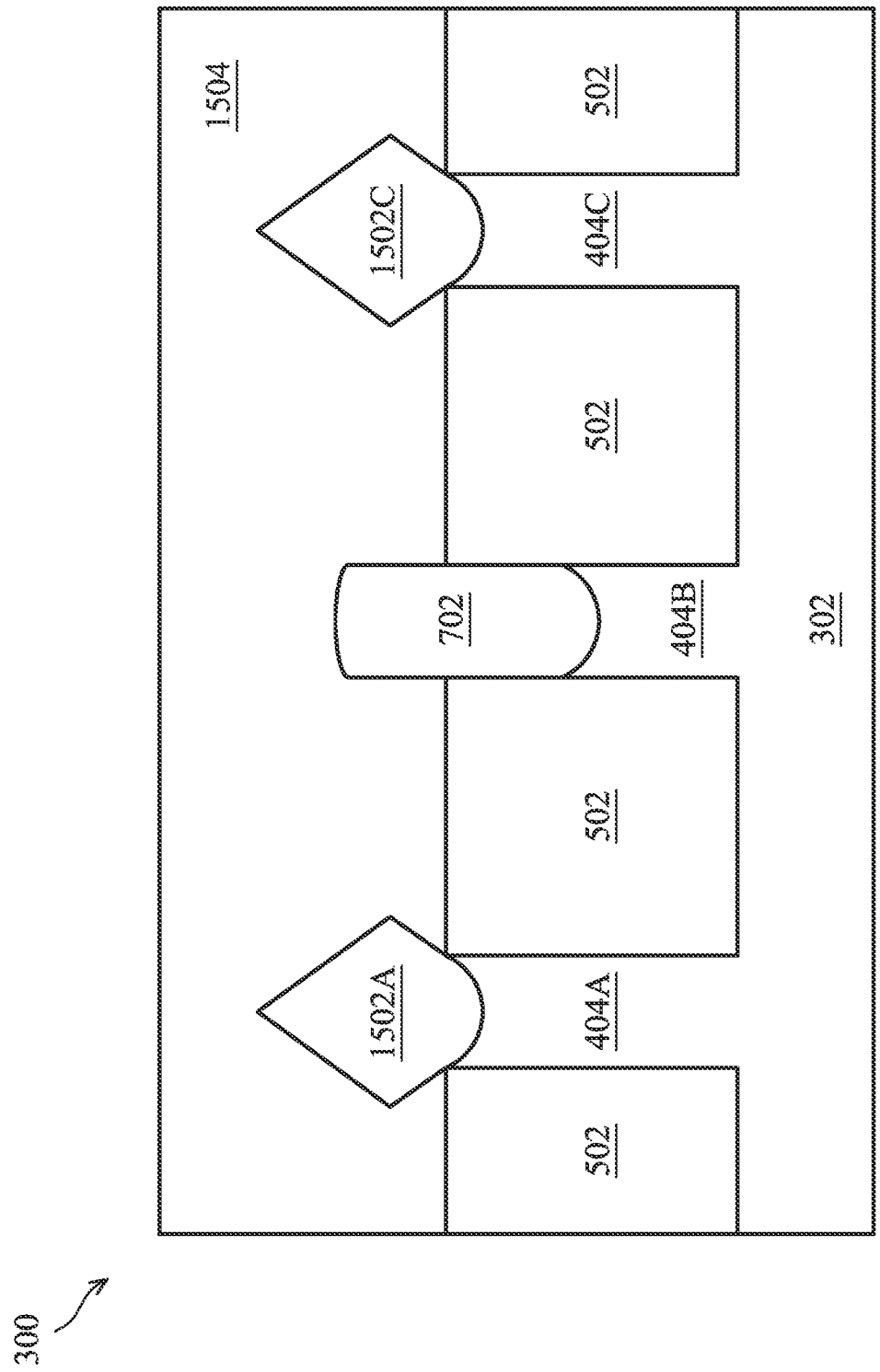
Figure 16B:
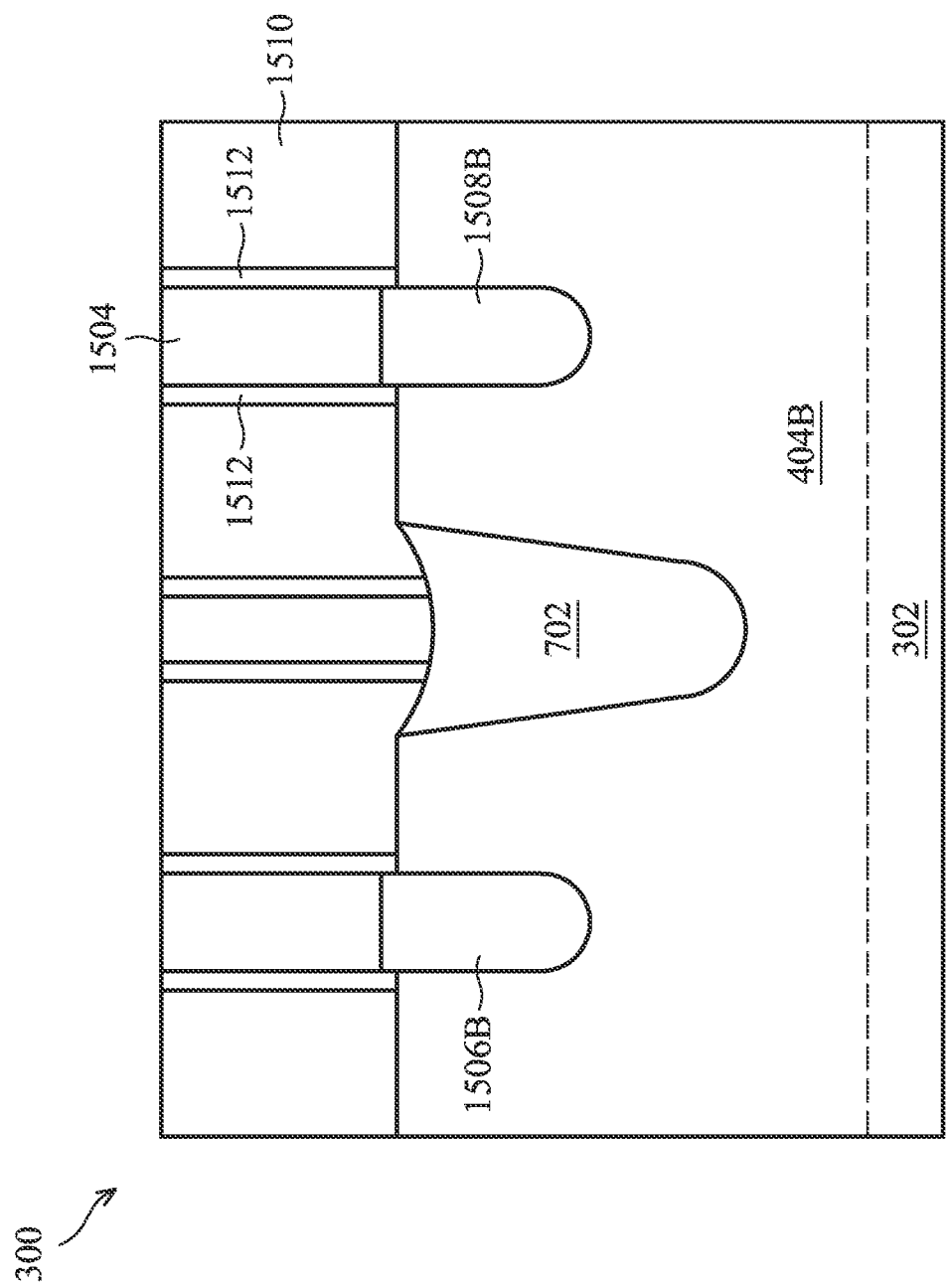
Figure 16C:
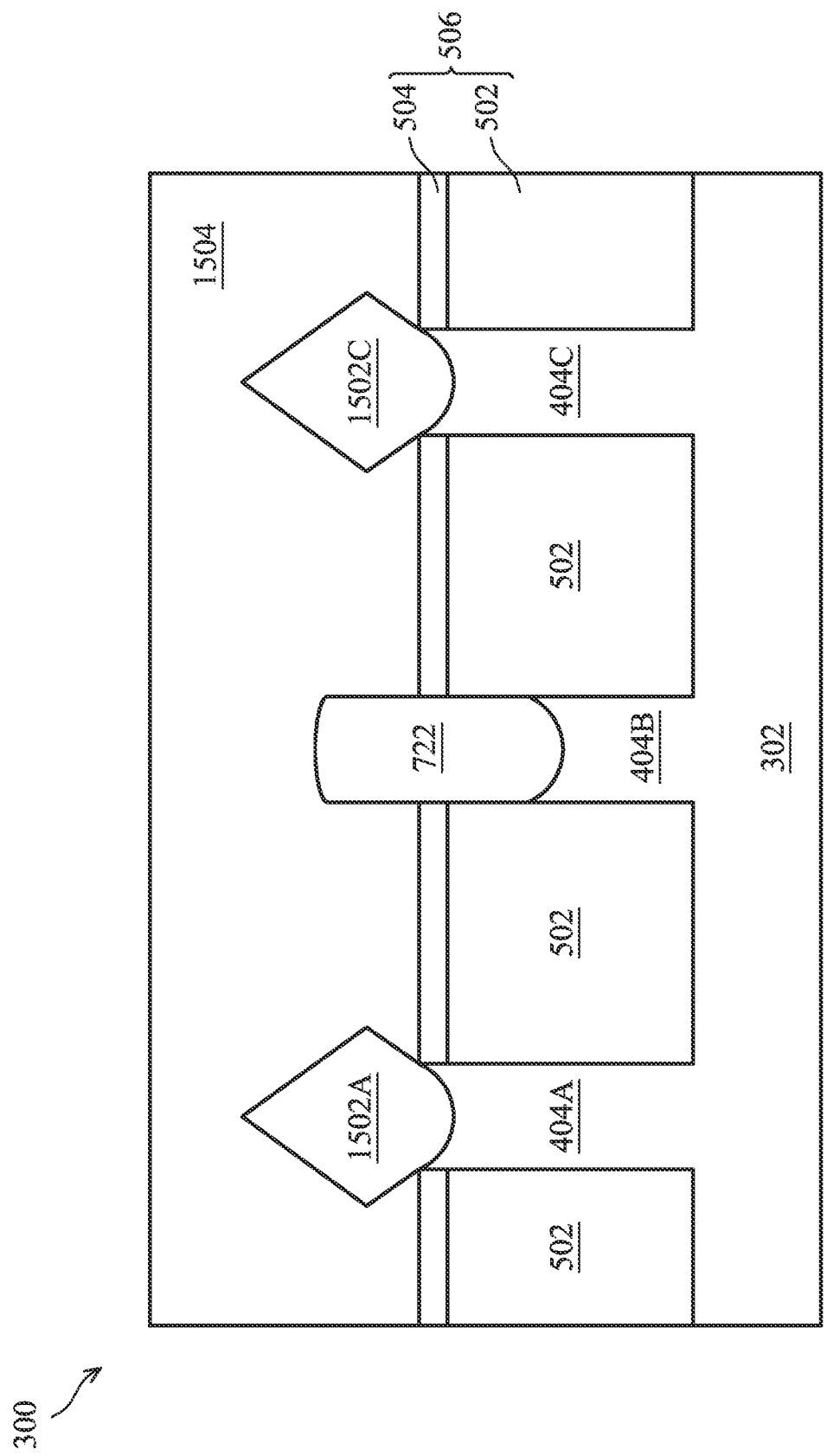
Figure 17A:
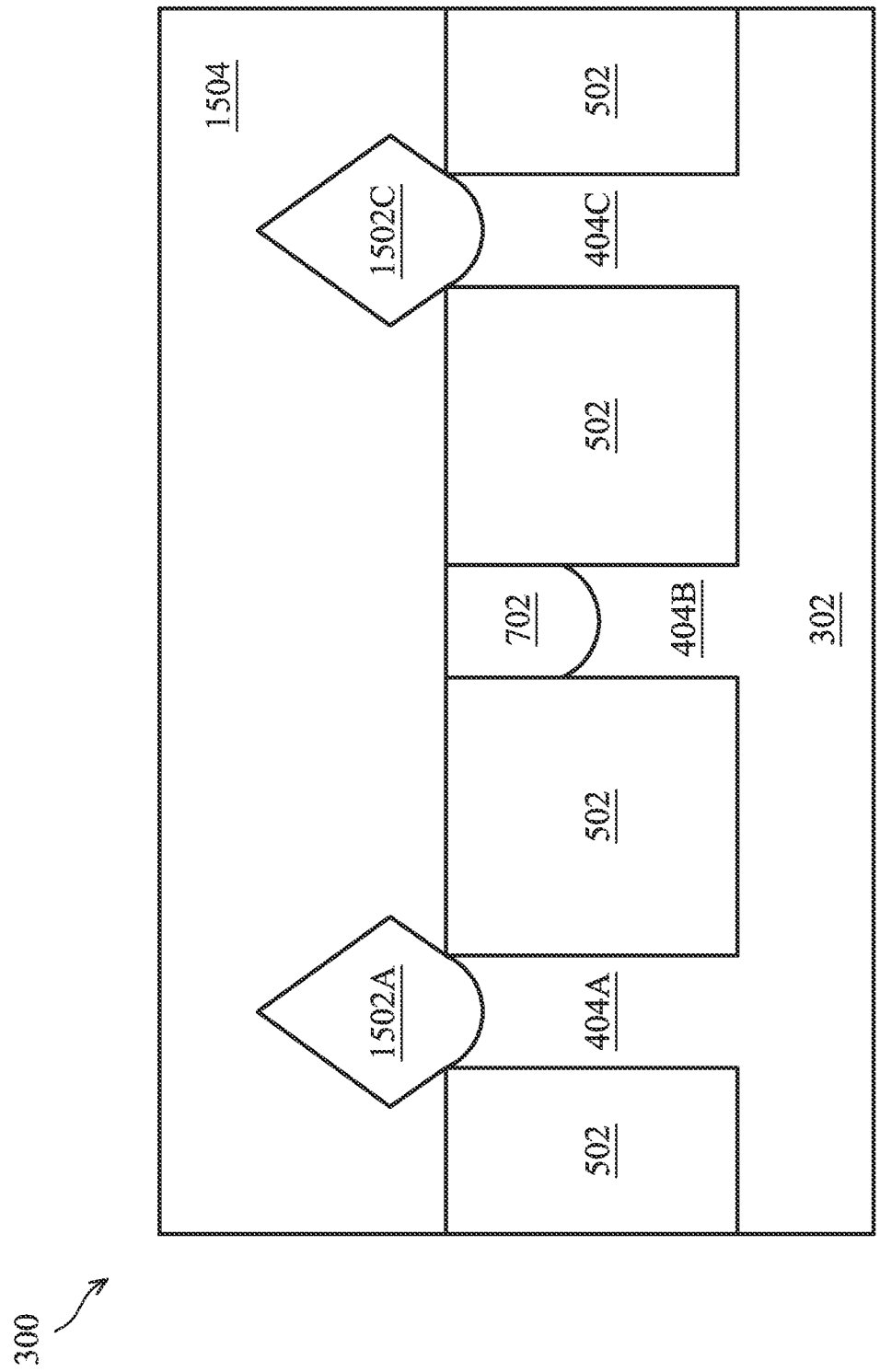
Figure 17B:
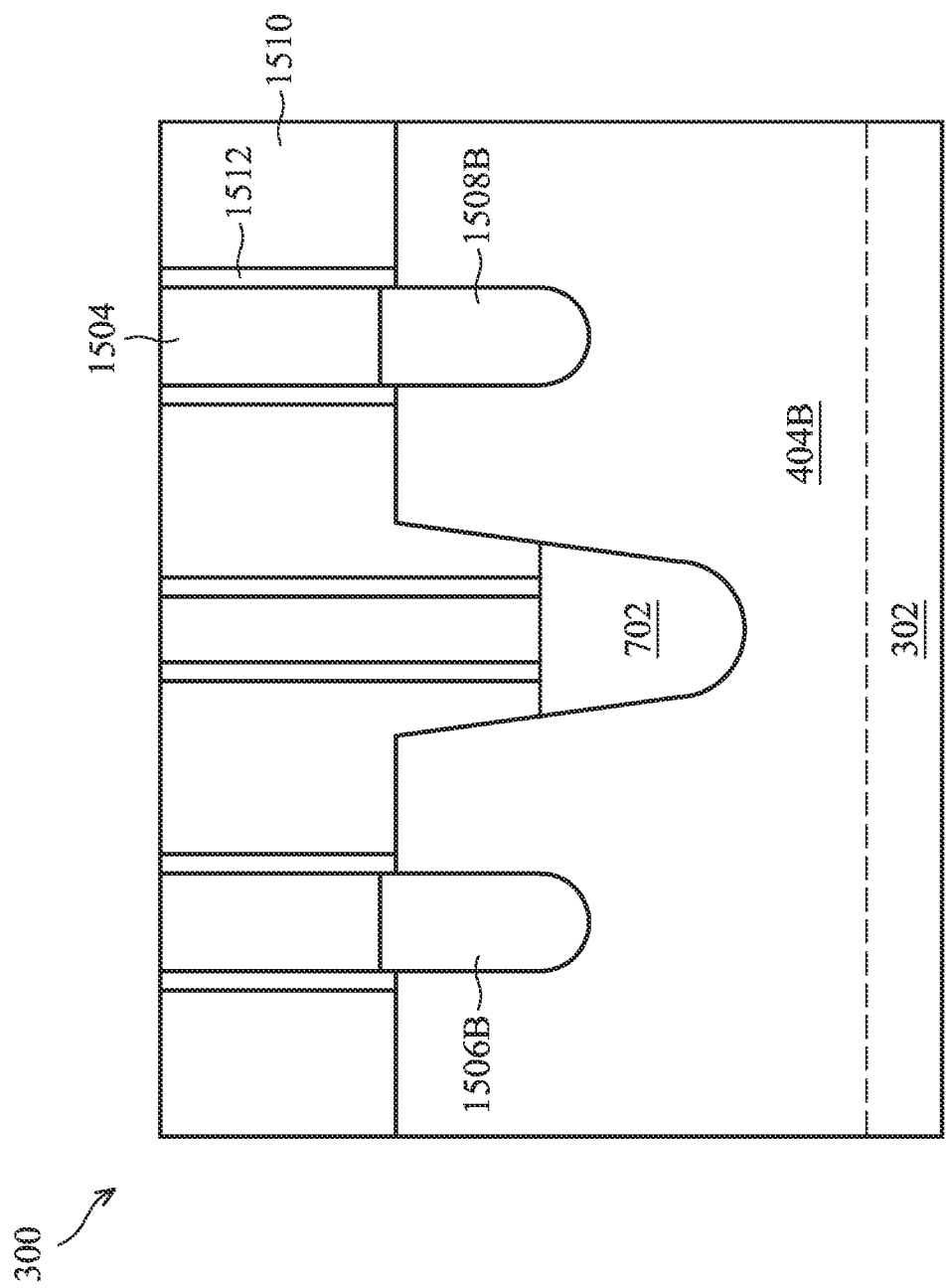
Figure 17C:
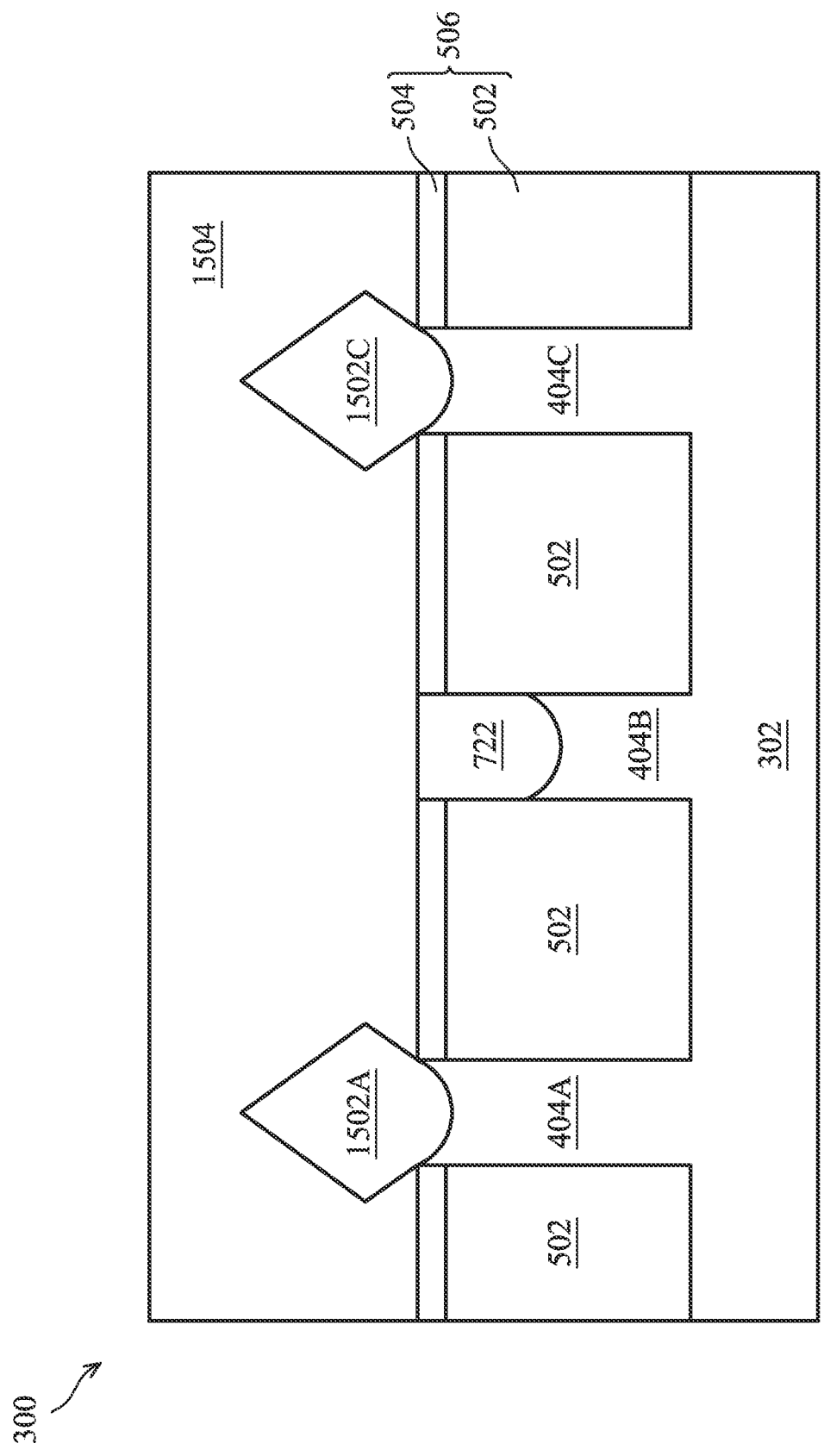

Corresponding to operation 220 of FIG. 2, FIGS. 15A-C, 16A-C, and 17A-C illustrate such features/structures (e.g., source/drain structures 1502A/1502C/1506B/1508B, an ILD 1504, an active gate structure 1510, a gate spacer 1512) formed based on the workpiece shown in the examples of FIGS. 8A-C, 9A-C, and 14A-C, respectively. The cross-sectional views of FIGS. 15A, 15C, 16A, 16C, 17A, and 17C are each cut along a direction in parallel with the lengthwise direction of an active/dummy gate structure of the FinFET device 300 (e.g., cross-section B-B indicated in FIG. 1). Corresponding to the same operation, FIGS. 15B, 16B, and 17B are each another cross-sectional view of the FinFET device 300, cut along a lengthwise direction of the active fin 404B (e.g., cross-section A-A indicated in FIG. 1).

After forming the dummy gate structures (not shown), a gate spacer (e.g., 1512) is formed on opposite sides of each dummy gate structure. Although the gate spacer 1512 is shown as a single layer in the example of FIGS. 15B, 16B, and 17B, it should be understood that the gate spacer can be formed to have any number of layers while remaining within the scope of the present disclosure. The gate spacer may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer. The shapes and formation methods of the gate spacer 1512 as illustrated in FIGS. 15B, 16B, and 17B are merely non-limiting examples, and other shapes and formation methods are possible. These and other variations are fully intended to be included within the scope of the present disclosure.

After forming the gate spacer(s), a number of source/drain structures (e.g., 1502A/1502C/1506B/1508B) are formed in each active fin and on the opposite sides of each dummy gate structure. It should be noted that since the active fin 404B is cut (by replacing a portion of the active fin 404B with the dielectric cut structure 702/722), a source/drain structure is formed on one of the sides of the dummy gate structure (instead of a pair of source/drain structures). Such a single source/drain structure (e.g., 1506B, 1508B) is opposite an active gate structure (which replaces the dummy gate structure) from the dielectric cut structure 702/722, as shown in FIGS. 15B, 16B, and 17B. The source/drain structures 1502A/1502C/1506B/1508B are formed by epitaxially growing a semiconductor material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIGS. 15B, 16B, and 17B, the epitaxial source/drain structures may have surfaces raised from respective surfaces of the semiconductor fin and may have facets. In some embodiments, the source/drain structures of the adjacent fins may merge to form a continuous epitaxial source/drain structure. In some embodiments, the source/drain structures of the adjacent fins may not merge together and remain separate source/drain structures. In some embodiments, when the resulting FinFET device is an n-type FinFET, the source/drain structures can include silicon carbide (SiC), silicon phosphorous (SiP), phosphorous-doped silicon carbon (SiCP), or the like. In some embodiments, when the resulting FinFET device is a p-type FinFET, the source/drain structures can include SiGe, and a p-type impurity such as boron or indium.

The epitaxial source/drain structures may be implanted with dopants to form source/drain structures followed by an annealing process. The implanting process may include forming and patterning masks such as a photoresist to cover the regions of the FinFET device 300 that are to be protected from the implanting process. The source/drain structures may have an impurity (e.g., dopant) concentration in a range from about $1\times10^{19}$ cm$^{-3}$ to about $1\times10^{21}$ cm$^{-3}$. P-type impurities, such as boron or indium, may be implanted in the source/drain structures of a P-type transistor. N-type impurities, such as phosphorous or arsenide, may be implanted in the source/drain structures of an N-type transistor. In some embodiments, the epitaxial source/drain structures may be in situ doped during their growth.

After forming the source/drain structures, an ILD (e.g., 1504) is formed over the source/drain structures. The ILD 1504 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 1504 is formed, an optional dielectric layer (not shown) is formed over the ILD 1504. The dielectric layer can function as a protection layer to prevent or reduces the loss of the ILD 1504 in subsequent etching processes. The dielectric layer may be formed of a suitable material, such as silicon nitride, silicon carbonitride, or the like, using a suitable method such as CVD, PECVD, or FCVD. After the dielectric layer is formed, a planarization process, such as a CMP process, may be performed to achieve a level upper surface for the dielectric layer. The CMP may also remove the mask (used to define the dummy gate structure). After the planarization process, the upper surface of the ILD 1504 or the dielectric layer (if formed) is level with the upper surface of the dummy gate, in some embodiments.

After forming the ILD, the dummy gate structures are replaced with a number of active gate structures (e.g., 1510), respectively. The active gate structure 1510 can include a gate dielectric layer, a metal gate layer, and one or more other layers, although it is shown as a single layer in FIGS. 15B, 16B, and 17B, for purposes of clarity. For example, the active gate structure 1510 may further include a capping layer and a glue layer. The capping layer can protect the underlying work function layer from being oxidized. In some embodiments, the capping layer may be a silicon-containing layer, such as a layer of silicon, a layer of silicon oxide, or a layer of silicon nitride. The glue layer can function as an adhesion layer between the underlying layer and a subsequently formed gate electrode material (e.g., tungsten) over the glue layer. The glue layer may be formed of a suitable material, such as titanium nitride.

The gate dielectric layer is formed in a corresponding gate trench to surround (e.g., straddle) one or more fins. In an embodiment, the gate dielectric layer can be the remaining portion of a dummy gate dielectric of the dummy gate structure. In another embodiment, the gate dielectric layer can be formed by removing the dummy gate dielectric, followed by conformal deposition or thermal reaction. In yet another embodiment, the gate dielectric layer can be formed by removing the dummy gate dielectric, followed by no further processing step (i.e., the gate dielectric layer may be a native oxide over the active fins).

The gate dielectric layer includes silicon oxide, silicon nitride, or multilayers thereof. In example embodiments, the gate dielectric layer includes a high-k dielectric material, and in these embodiments, the gate dielectric layer may have a k value greater than about 7.0, and may include a metal oxide or a silicate of Hf, Al, Zr, La, Mg, Ba, Ti, Pb, or combinations thereof. The formation methods of gate dielectric layer may include molecular beam deposition (MBD), atomic layer deposition (ALD), PECVD, and the like. A thickness of the gate dielectric layer may be between about 8 Å and about 20 Å, as an example.

The metal gate layer is formed over the gate dielectric layer. The metal gate layer may be a P-type work function layer, an N-type work function layer, multi-layers thereof, or combinations thereof, in some embodiments. Accordingly, the metal gate layer is sometimes referred to as a work function layer. For example, the metal gate layer may be an N-type work function layer. In the discussion herein, a work function layer may also be referred to as a work function metal. Example P-type work function metals that may be included in the gate structures for P-type devices include TIN, TaN, Ru, Mo, Al, WN, ZrSi2, MoSi2, TaSi2, NiSi2, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof.

A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process. The thickness of a P-type work function layer may be between about 8 Å and about 15 Å, and the thickness of an N-type work function layer may be between about 15 Å and about 30 Å, as an example.

Figure 18:
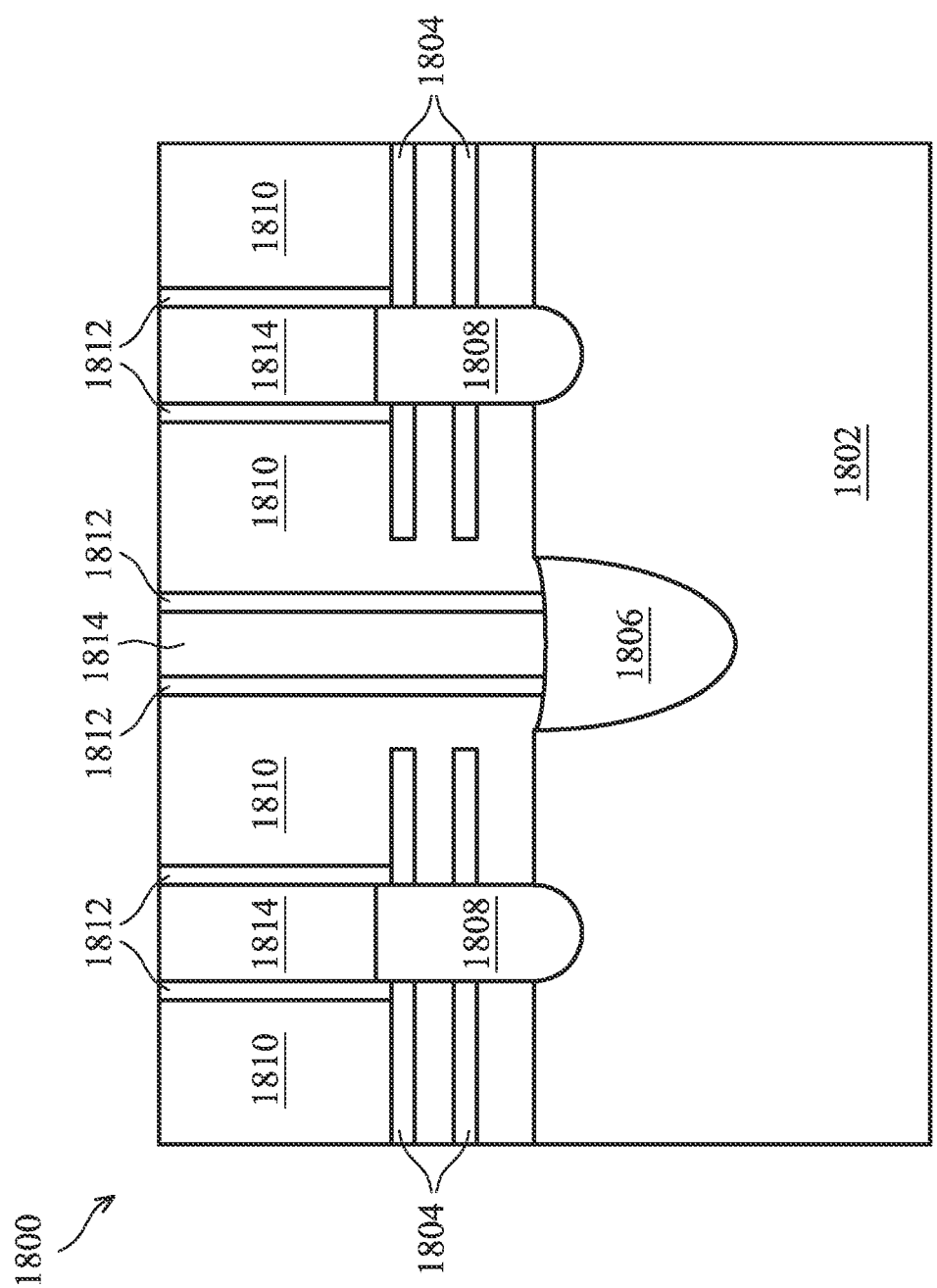
FIG. 18 illustrate a cross-sectional view of an example GAA transistor device during one of various fabrication stages, made by at least some of the operations of the method of FIG. 2, in accordance with some embodiments.

As mentioned above, at least some of the operations of the disclosed method can also be used to make a GAA transistor device. FIG. 18 depicts a cross-sectional view of a GAA transistor device 1800, cut along the lengthwise direction of a fin structure, which includes a number of semiconductor layers (which are sometimes referred to as nanosheets, nanowires, or otherwise nanostructures). As shown, the GAA transistor device 1800 that includes a number of semiconductor layers 1804 is formed on a substrate 1802 (similar to the substrate 302). The semiconductor layers 1804 are vertically separated from each other. The GAA transistor device 1800 also includes a dielectric cut structure 1806 (similar to the dielectric cut structure 702/722), source/drain structures 1808 (similar to the source/drain structures 1502A/1502C/1506B/1508B), an active gate structure 1810 (similar to the active gate structure 1510), a gate spacer 1812 (similar to the gate spacer 1512), and an ILD 1814 (similar to the ILD 1504). Thus, the discussions of such features/structures are not repeated. Although not shown, it should be understood that an inner spacer can be coupled between each semiconductor layer 1804 and the source/drain structure 1808, while remaining within the scope of the present disclosure. In some embodiments, the active gate structure 1810 wraps around each of the semiconductor layers 1804.

In one aspect of the present disclosure, a method for making a semiconductor device is disclosed. The method includes forming a first fin structure, a second fin structure, and a third fin structure over a substrate, wherein the first through third fin structures all extend along a first lateral direction, and the second fin structure is disposed between the first and third fin structures. The method includes forming a mold by filling up trenches between neighboring ones of the first through third fin structures with a first dielectric material. The method includes cutting the second fin structure by removing an upper portion of the second fin structure. The method includes replacing the upper portion of the second fin structure with a second dielectric material to form a dielectric cut structure. The method includes recessing the mold to expose upper portions of the first fin structure and the third fin structure, respectively.

In another aspect of the present disclosure, a method for making a semiconductor device is disclosed. The method includes forming a first fin structure protruding from a substrate, wherein the first fin structure extends along a first lateral direction. The method includes depositing a first dielectric material extending along sidewalls of the first fin structure to form a mold. The method includes removing a portion of the first fin structure, while using the mold as an etch stop layer. The method includes filling the removed portion with a second dielectric material to form a dielectric cut structure.

In yet another aspect of the present disclosure, a semiconductor device is disclosed. The semiconductor device includes a first fin structure, a second fin structure, and a third fin structure over a substrate, wherein the first through third fin structures all extend along a first lateral direction, and the second fin structure is disposed between the first and third fin structures. The semiconductor device includes a dielectric cut structure disposed above the second fin structure, wherein the dielectric cut structures includes a first dielectric material. The semiconductor device includes a mold disposed between the first fin structure and a combination of the second fin structure and the dielectric cut structure, and between the third fin structure and a combination of the second fin structure and the dielectric cut structure, wherein the mold includes a second dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making a semiconductor device, comprising:
    forming a first fin structure, a second fin structure, and a third fin structure over a substrate, wherein the first through third fin structures all extend along a first lateral direction, and the second fin structure is disposed between the first and third fin structures;
    forming a mold by filling up trenches between neighboring ones of the first through third fin structures with a first dielectric material, wherein respective upper surfaces of the mold and the first through third fin structures are aligned with one another;
    after forming the mold, removing an upper portion of the second fin structure to form a recess extending along the first lateral direction, wherein the recess is formed through the mold being exposed and partially extends into the second fin structure, causing the upper surface of the second fin structure to be vertically interposed between the upper surface of the mold and a lower surface of the mold;
    forming a dielectric cut structure by filling the recess with a second dielectric material different from the first dielectric material, wherein the dielectric cut structure extends also along the first lateral direction and directly contacts remaining portions of the second fin structure, and wherein the second dielectric material has a higher etch selectivity relative to the first dielectric material during a fin removal process; and
    recessing the mold, causing upper portions of the first fin structure and the third fin structure to protrude from the recessed mold.

2. The method of claim 1, further comprising forming a gate structure that extends along a second lateral direction perpendicular to the first lateral direction, wherein the gate structure straddles a first portion of the first fin structure, a second portion of the second fin structure, and a third portion of the third fin structure, respectively.

3. The method of claim 2, wherein the second portion includes a cut sidewall facing the first lateral direction.

4. The method of claim 3, further comprising forming a first pair of source/drain structures in the first fin structure on opposite sides of the gate structure, a second source/drain structure in the second fin structure on a side opposite the gate structure from the cut sidewall, and a third pair of source/drain structures in the third fin structure on opposite sides of the gate structure.

5. The method of claim 1, wherein the step of cutting the second fin structure comprises etching the upper portion of the second fin structure, while using the mold as an etch stop layer.

6. The method of claim 1, wherein the step of recessing the mold comprises exposing an upper portion of the dielectric cut structure.

7. The method of claim 1, wherein the step of recessing the mold comprises exposing an upper portion of the dielectric cut structure, and wherein subsequently to the step of recessing the mold, the method further comprises modifying a profile of the dielectric cut structure.

8. The method of claim 1, wherein the first through third fin structures each include a plurality of semiconductor layers vertically spaced from each other.

9. A method for making a semiconductor device, comprising:
    forming a first fin structure protruding from a substrate, wherein the first fin structure extends along a first lateral direction;
    depositing a first dielectric material extending along sidewalls of the first fin structure to form a mold, wherein the first dielectric material has a substantially lower etch rate in a fin removal process compared to an etch rate of the first fin structure, wherein respective upper surfaces of the mold and the first fin structure are aligned with one another;
    performing the fin removal process to remove a portion of the first fin structure, while using the mold as an etch stop layer, wherein during the removing, the mold, being exposed, prevents lateral etching into regions adjacent to the removed portion, causing the upper surface of the first fin structure to be vertically interposed between the upper surface of the mold and a lower surface of the mold; and
    filling the removed portion with a second dielectric material to form a dielectric cut structure, wherein the dielectric cut structure extends also along the first lateral direction and directly contacts remaining portions of the first fin structure, and wherein the second dielectric material has a higher etch selectivity relative to the first dielectric material.

10. The method of claim 9, further comprising forming a second fin structure protruding from the substrate, wherein the second fin structure also extends along the first lateral direction.

11. The method of claim 10, further comprising recessing the mold to expose upper portions of the dielectric cut structure and the second fin structure, respectively.

12. The method of claim 10, further comprising:
    recessing the mold to expose upper portions of the dielectric cut structure and the second fin structure, respectively; and
    modifying a profile of the dielectric cut structure.

13. The method of claim 9, further comprising forming a gate structure that extends along a second lateral direction perpendicular to the first lateral direction, wherein the gate structure extends a cut sidewall facing the first lateral direction.

14. The method of claim 13, further comprising forming a source/drain structure in the first fin structure on a side opposite the gate structure from the cut sidewall.

15. A method for making a semiconductor device, comprising:
    forming a first fin structure protruding from a substrate, wherein the first fin structure extends along a first lateral direction;

forming a second fin structure protruding from the substrate, wherein the second fin structure also extends along the first lateral direction;

depositing a first dielectric material extending along sidewalls of the first fin structure to form a mold, wherein the first dielectric material has a substantially lower etch rate in a fin removal process compared to an etch rate of the first fin structure, and wherein respective upper surfaces of the mold and the first and second fin structures are aligned with one another;

performing the fin removal process to remove a portion of the first fin structure, while using the mold as an etch stop layer, wherein during the removing, the mold, being exposed, prevents lateral etching into regions adjacent to the removed portion, causing the upper surface of the fin structure to be vertically interposed between the upper surface of the mold and a lower surface of the mold; and filling the removed portion with a second dielectric material to form a dielectric cut structure, wherein the dielectric cut structure extends also along the first lateral direction and directly contacts remaining portions of the first fin structure, and wherein the second dielectric material has a higher etch selectivity relative to the first dielectric material.

16. The method of claim 15, further comprising recessing the mold to expose upper portions of the dielectric cut structure and the second fin structure, respectively.

17. The method of claim 15, further comprising:
recessing the mold to expose upper portions of the dielectric cut structure and the second fin structure, respectively; and
modifying a profile of the dielectric cut structure.

18. The method of claim 15, further comprising forming a gate structure that extends along a second lateral direction perpendicular to the first lateral direction, wherein the gate structure extends a cut sidewall facing the first lateral direction.

19. The method of claim 18, further comprising forming a source/drain structure in the first fin structure on a side opposite the gate structure from the cut sidewall.

20. The method of claim 17, wherein the modified profile of the dielectric cut structure has a tapered profile.

* * * * *